US012567351B2

(12) United States Patent
Kawashima et al.

(10) Patent No.: US 12,567,351 B2
(45) Date of Patent: Mar. 3, 2026

(54) DISPLAY DEVICE AND ELECTRONIC DEVICE

(71) Applicant: SEMICONDUCTOR ENERGY LABORATORY CO., LTD., Atsugi (JP)

(72) Inventors: Susumu Kawashima, Atsugi (JP); Koji Kusunoki, Isehara (JP); Tomoaki Atsumi, Hadano (JP); Naoto Kusumoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/718,315

(22) PCT Filed: Dec. 5, 2022

(86) PCT No.: PCT/IB2022/061755
§ 371 (c)(1),
(2) Date: Jun. 10, 2024

(87) PCT Pub. No.: WO2023/111764
PCT Pub. Date: Jun. 22, 2023

(65) Prior Publication Data
US 2025/0061833 A1      Feb. 20, 2025

(30) Foreign Application Priority Data
Dec. 16, 2021    (JP) ................................. 2021-204130

(51) Int. Cl.
*G09G 3/20*          (2006.01)
*G09G 3/32*          (2016.01)
(Continued)

(52) U.S. Cl.
CPC ......... *G09G 3/2081* (2013.01); *G09G 3/2011* (2013.01); *G09G 3/2014* (2013.01);
(Continued)

(58) Field of Classification Search
CPC .. G09G 3/2081; G09G 3/2011; G09G 3/2014; G09G 3/32; G09G 2300/0852;
(Continued)

(56) References Cited

U.S. PATENT DOCUMENTS

| | | | |
|---|---|---|---|
| 7,674,650 | B2 | 3/2010 | Akimoto et al. |
| 7,732,819 | B2 | 6/2010 | Akimoto et al. |

(Continued)

FOREIGN PATENT DOCUMENTS

| | | |
|---|---|---|
| CN | 110634433 A | 12/2019 |
| CN | 111243514 A | 6/2020 |

(Continued)

OTHER PUBLICATIONS

International Search Report (Application No. PCT/IB2022/061755), dated Feb. 28, 2023.

(Continued)

*Primary Examiner* — Roberto W Flores
(74) *Attorney, Agent, or Firm* — Fish & Richardson P.C.

(57)          ABSTRACT

A display device whose change in chromaticity is small and grayscale controllability is high is provided. The display device can turn on and turn off a light-emitting device by PAM and PWM control (a pulse width control involving changes in amplitude). The display device writes the same input signal (data potential) to a first node and a second node to turn on the light-emitting device in accordance with a potential of the first node and generate a pulse signal in accordance with a potential of the second node. The potential of the first node can be reset in accordance with the generated pulse signal. Therefore, the light-emitting device can emit light for a desired period with a desired emission intensity.

7 Claims, 23 Drawing Sheets

(51) Int. Cl.

| | |
|---|---|
| *H01L 25/16* | (2023.01) |
| *H10D 86/40* | (2025.01) |
| *H10D 86/60* | (2025.01) |

(52) U.S. Cl.
CPC ............. *G09G 3/32* (2013.01); *H01L 25/167* (2013.01); *H10D 86/423* (2025.01); *H10D 86/60* (2025.01); *G09G 2300/0852* (2013.01); *G09G 2310/08* (2013.01)

(58) Field of Classification Search
CPC ........ G09G 2310/08; G09G 2320/0633–0646; G09G 2310/0259; G09G 3/30–3291; H01L 25/167; H01L 27/1225
See application file for complete search history.

(56) References Cited

U.S. PATENT DOCUMENTS

| | | | |
|---|---|---|---|
| 7,910,490 | B2 | 3/2011 | Akimoto et al. |
| 7,932,521 | B2 | 4/2011 | Akimoto et al. |
| 8,274,077 | B2 | 9/2012 | Akimoto et al. |
| 8,466,463 | B2 | 6/2013 | Akimoto et al. |
| 8,629,069 | B2 | 1/2014 | Akimoto et al. |
| 8,669,550 | B2 | 3/2014 | Akimoto et al. |
| 8,790,959 | B2 | 7/2014 | Akimoto et al. |
| 8,796,069 | B2 | 8/2014 | Akimoto et al. |
| 9,099,562 | B2 | 8/2015 | Akimoto et al. |
| 10,304,962 | B2 | 5/2019 | Akimoto et al. |
| 11,222,583 | B2 | 1/2022 | Takahashi et al. |
| 11,545,074 | B2 | 1/2023 | Yamashita et al. |
| 11,783,757 | B2 | 10/2023 | Takahashi et al. |
| 11,823,614 | B2 | 11/2023 | Watanabe et al. |
| 11,922,859 | B2 | 3/2024 | Kusunoki et al. |
| 2008/0308805 | A1 | 12/2008 | Akimoto et al. |
| 2010/0136743 | A1 | 6/2010 | Akimoto et al. |
| 2011/0104851 | A1 | 5/2011 | Akimoto et al. |
| 2011/0117697 | A1 | 5/2011 | Akimoto et al. |
| 2011/0121290 | A1 | 5/2011 | Akimoto et al. |
| 2011/0163311 | A1 | 7/2011 | Akimoto et al. |
| 2014/0367705 | A1 | 12/2014 | Bibl et al. |
| 2015/0340513 | A1 | 11/2015 | Akimoto et al. |
| 2019/0051759 | A1 | 2/2019 | Akimoto et al. |
| 2019/0326444 | A1 | 10/2019 | Akimoto et al. |
| 2019/0371231 | A1* | 12/2019 | Kim ..................... G09G 3/3003 |
| 2019/0371232 | A1 | 12/2019 | Kim et al. |
| 2021/0118363 | A1 | 4/2021 | Zhang |
| 2021/0201786 | A1 | 7/2021 | Ma |
| 2021/0210003 | A1* | 7/2021 | Kim ..................... G09G 3/2014 |
| 2021/0358394 | A1 | 11/2021 | Yamashita et al. |
| 2022/0069137 | A1 | 3/2022 | Akimoto et al. |
| 2022/0101783 | A1* | 3/2022 | Han ......................... G09G 3/32 |
| 2022/0330401 | A1* | 10/2022 | Hashimoto .......... G09G 3/3233 |
| 2023/0107775 | A1* | 4/2023 | Kim .................. H03K 17/6871 345/83 |
| 2023/0178012 | A1* | 6/2023 | Kim ..................... G09G 3/2014 345/55 |
| 2023/0290301 | A1 | 9/2023 | Watanabe et al. |
| 2024/0021150 | A1 | 1/2024 | Takahashi et al. |
| 2024/0112626 | A1* | 4/2024 | Hwang ................ G09G 3/2014 |
| 2024/0339072 | A1 | 10/2024 | Kusunoki et al. |
| 2024/0346985 | A1 | 10/2024 | Kusunoki et al. |
| 2024/0420626 | A1 | 12/2024 | Kawashima et al. |

FOREIGN PATENT DOCUMENTS

| | | |
|---|---|---|
| CN | 112349250 A | 2/2021 |
| CN | 112863429 A | 5/2021 |
| EP | 3863006 A | 8/2021 |
| JP | 2007-096055 A | 4/2007 |
| JP | 2007-123861 A | 5/2007 |
| JP | 2020-056967 A | 4/2020 |
| KR | 2019-0137658 A | 12/2019 |
| KR | 2020-0011165 A | 2/2020 |
| KR | 2021-0055028 A | 5/2021 |
| WO | WO-2019/231074 | 12/2019 |
| WO | WO-2020/071826 | 4/2020 |

OTHER PUBLICATIONS

Written Opinion (Application No. PCT/IB2022/061755), dated Feb. 28, 2023.

Seong.J et al., "Multi-bit MIP(Memory-in-Pixel)-based Pixel Circuit of CMOS Backplane for Micro-LED Display", SID Digest '20 : SID International Symposium Digest of Technical Papers, Sep. 25, 2020, vol. 51, No. 1, pp. 359-362.

Tamaki.M et al., "A 3.9-inch LTPS TFT Full Color MicroLED Display with Novel Driving and Reflector Cavity Process", SID Digest '20 : SID International Symposium Digest of Technical Papers, Sep. 25, 2020, vol. 51, No. 1, pp. 111-114.

Fu.J et al., "Design and Verification of a Driving System Suitable for LED Display Devices", SID Digest '20 : SID International Symposium Digest of Technical Papers, Sep. 25, 2020, vol. 51, No. 1, pp. 1727-1729.

* cited by examiner

FIG. 2A
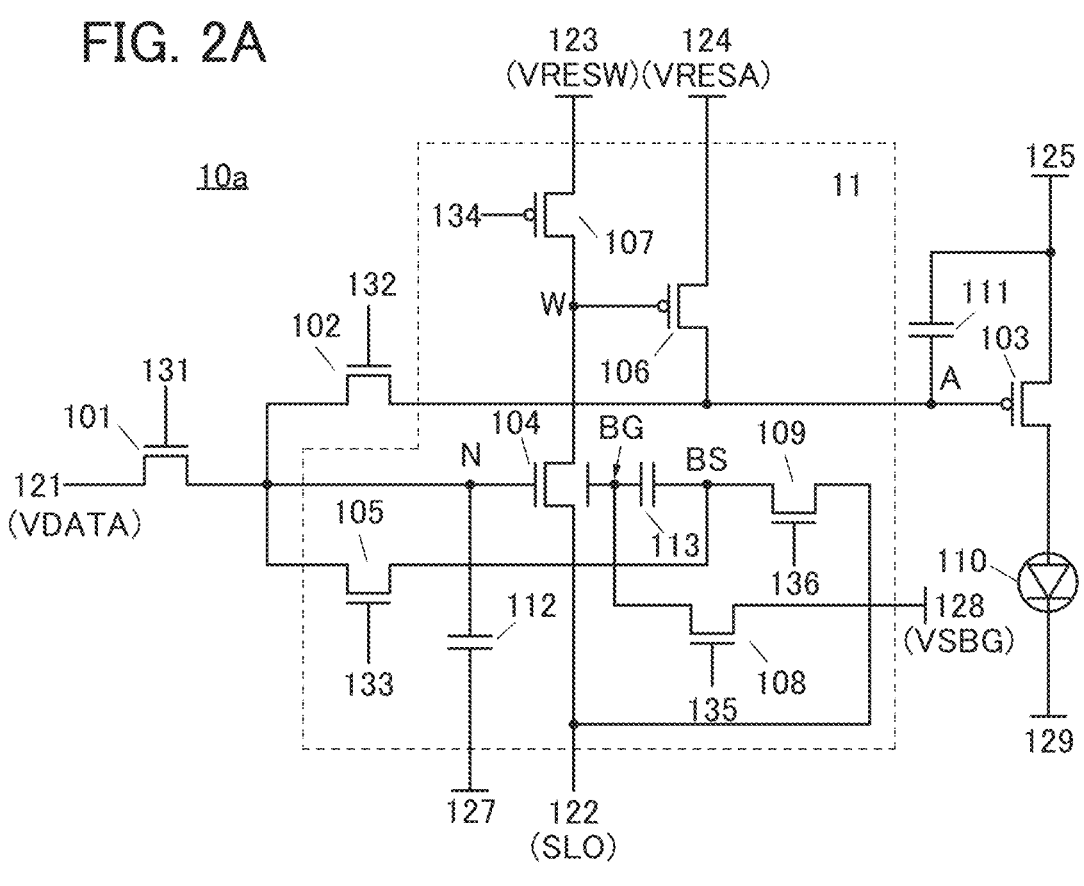
FIG. 2B
FIG. 2C
SLO_H>VDATA>SLO_L
FIG. 2D
Vbgs=constant
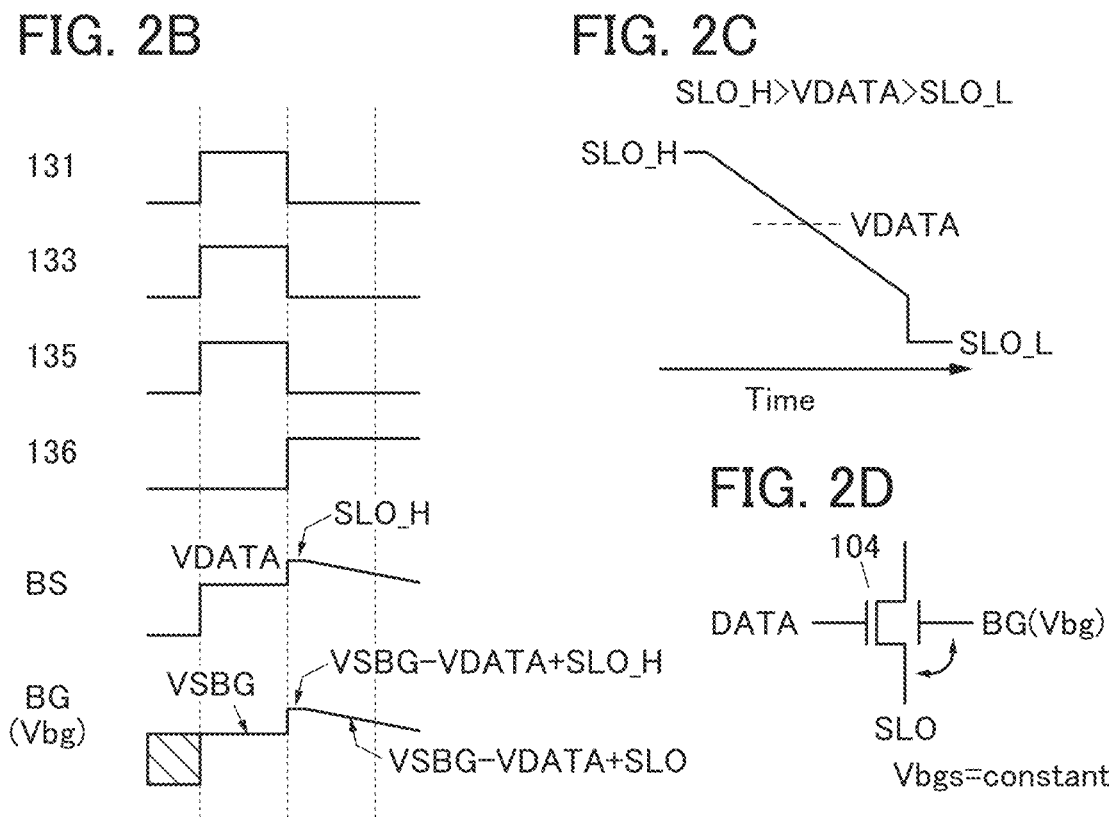

331
330
320
310

331
330
321
320
312
310
311

100A

100B

DISPLAY DEVICE AND ELECTRONIC DEVICE

CROSS REFERENCE TO RELATED APPLICATIONS

This application is a U.S. National Phase Application under 35 U.S.C. § 371 of International Application PCT/IB2022/061755, filed on Dec. 5, 2022, which is incorporated by reference and claims the benefit of a foreign priority application filed in Japan on Dec. 16, 2021, as Application No. 2021-204130.

TECHNICAL FIELD

One embodiment of the present invention relates to a display device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. As a more specific example of the technical field of one embodiment of the present invention disclosed in this specification, a semiconductor apparatus, a display device, a liquid crystal display device, a light-emitting apparatus, a lighting device, a power storage device, a memory device, an image capturing device, an operation method thereof, or a manufacturing method thereof can be given.

Note that in this specification and the like, a semiconductor apparatus generally means a device that can function by utilizing semiconductor characteristics. A transistor and a semiconductor circuit are embodiments of semiconductor apparatuses. In addition, in some cases, a memory device, a display device, an image capturing device, or an electronic device includes a semiconductor apparatus.

BACKGROUND ART

A display device and a lighting device including a micro light-emitting diode (hereinafter, referred to as a micro LED (LED: Light Emitting Diode)) have been proposed (e.g., Patent Document 1). A display device including a micro LED is capable of displaying with high luminance and has high reliability, and thus is a promising next-generation display.

A technique for forming transistors using a metal oxide formed over a substrate has been attracting attention. For example, Patent Document 2 and Patent Document 3 each disclose a technique in which a transistor formed using zinc oxide or an In—Ga—Zn-based oxide is used as a switching element or the like of a pixel in a display device.

REFERENCE

Patent Document

[Patent Document 1] Specification of United States Patent Application Publication No. 2014/0367705
[Patent Document 2] Japanese Published Patent Application No. 2007-123861
[Patent Document 3] Japanese Published Patent Application No. 2007-96055

SUMMARY OF THE INVENTION

Problems to be Solved by the Invention

In a display device using a light-emitting device (also referred to as a light-emitting element), luminance can be changed by controlling current flowing through the light-emitting device. However, the characteristic of an LED that is one of light-emitting devices is that the chromaticity is likely to change in accordance with the current density.

Thus, when luminance of the LED is controlled by pulse amplitude modulation (PAM), color reproducibility might be poor. Accordingly, driving of the LED is preferably controlled by pulse width modulation (PWM) in which luminance is controlled by a duty ratio. With the use of PWM control, the current density can be constant; thus, luminance can be controlled without occurrence of chromaticity variation.

On the other hand, because of response characteristics of the LED and a transistor for driving the LED, there is a lower limit for the duty ratio capable of being controlled stably. Therefore, PWM control of the LED has a problem that it is difficult to control the duty ratio at a low grayscale level side where the duty ratio is small.

Therefore, one object of one embodiment of the present invention is to provide a display device whose change in chromaticity is small and grayscale controllability is high. Another object is to provide a display device including a pixel circuit for generating a pulse signal. Another object is to provide a display device including a pixel circuit capable of performing PAM control and PWM control. Another object is to provide a display device having excellent display characteristics. Another object is to provide a display device with a narrow bezel.

Another object is to provide a display device with low power consumption. Another object is to provide a highly reliable display device. Another object is to provide a novel display device or the like. Another object is to provide a method for operating any of the above display devices. Another object is to provide a novel semiconductor apparatus or the like.

Note that the description of these objects does not preclude the existence of other objects. Note that one embodiment of the present invention does not need to achieve all the objects. Note that other objects will be apparent from the description of the specification, the drawings, the claims, and the like, and other objects can be derived from the description of the specification, the drawings, the claims, and the like.

Means for Solving the Problems

One embodiment of the present invention relates to a display device including a pixel circuit capable of performing PAM control and PWM control.

A first embodiment of the present invention is a display device including a pulse signal generation portion, a light-emitting device, a first node, and a second node in a pixel. The first node is electrically connected to an input portion of the pulse signal generation portion. The second node is electrically connected to an output portion of the pulse signal generation portion. The first node and the second node are electrically connected to each other through a transistor. The pixel makes the light-emitting device emit light in accordance with a data potential input to the second node. The pulse signal generation portion generates a pulse signal in accordance with the data potential input to the first node.

The pixel resets a potential of the second node in accordance with the pulse signal and makes the light-emitting device turn off.

A second embodiment of the present invention is a display device including a pulse signal generation portion, a first node, a second node, a first transistor, a second transistor, a third transistor, a first capacitor, and a light-emitting device in a pixel. The first node is electrically connected to one of a source and a drain of the first transistor, one of a source and a drain of the second transistor, and an input portion of the pulse signal generation portion. The second node is electrically connected to the other of the source and the drain of the second transistor, a gate of the third transistor, one electrode of the first capacitor, and an output portion of the pulse signal generation portion. One of a source and a drain of the third transistor is electrically connected to one electrode of the light-emitting device. The other of the source and the drain of the third transistor is electrically connected to the other electrode of the first capacitor.

The pulse signal generation portion can include fourth to ninth transistors and a second capacitor. The fourth transistor can include a first gate and a second gate. The first gate of the fourth transistor and one of a source and a drain of the fifth transistor can be electrically connected to the first node. One of a source and a drain of the fourth transistor can be electrically connected to a gate of the sixth transistor and one of a source and a drain of the seventh transistor. The second gate of the fourth transistor can be electrically connected to one of a source and a drain of the eighth transistor and one electrode of the second capacitor. The other electrode of the second capacitor can be electrically connected to one of a source and a drain of the ninth transistor. The other of the source and the drain of the ninth transistor can be electrically connected to the other of the source and the drain of the fourth transistor. One of a source and a drain of the sixth transistor can be electrically connected to the second node.

A signal potential with a ramp waveform can be input to the other of the source and the drain of the fourth transistor.

The first transistor, the second transistor, the fourth transistor, the fifth transistor, the eighth transistor, and the ninth transistor can each be an n-channel transistor, and the third transistor, the sixth transistor, and the seventh transistor can each be a p-channel transistor.

The n-channel transistor preferably contains a metal oxide in a channel formation region, and the p-channel transistor preferably contains silicon in a channel formation region.

In the second embodiment of the present invention, the pixel can make the light-emitting device emit light in accordance with a data potential input to the first node, the pulse signal generation portion can generate a pulse signal in accordance with the data potential input to the second node, and the pixel can reset a potential of the first node in accordance with the pulse signal and make the light-emitting device turn off.

The light-emitting device is preferably a micro LED.

Effect of the Invention

With one embodiment of the present invention, a display device whose change in chromaticity is small and grayscale controllability is high can be provided. Alternatively, a display device including a pixel circuit for generating a pulse signal can be provided. Alternatively, a display device including a pixel circuit capable of performing PAM control and PWM control can be provided. Alternatively, a display device with excellent display characteristics can be provided. Alternatively, a display device with a narrow bezel can be provided.

Alternatively, a display device with low power consumption can be provided. Alternatively, a highly reliable display device can be provided. Alternatively, a novel display device or the like can be provided. Alternatively, a method for operating any of the above display devices can be provided. Alternatively, a novel semiconductor apparatus or the like can be provided.

BRIEF DESCRIPTION OF THE DRAWINGS

FIG. 2A is a diagram illustrating a pixel circuit. FIG. 2B is a timing chart illustrating the operation of the pixel circuit. FIG. 2C is a diagram illustrating a slope potential. FIG. 2D is a diagram illustrating a transistor.

MODE FOR CARRYING OUT THE INVENTION

Figure 1:
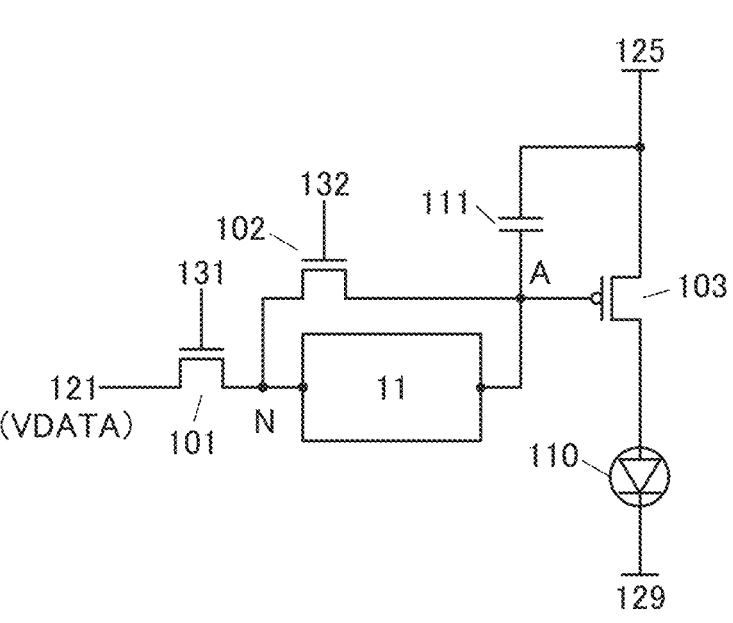
FIG. 1 is a diagram illustrating a pixel circuit.

Embodiments will be described in detail with reference to drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that each operate as a switch are connected in series or in parallel. Furthermore, in some cases, capacitors are divided and arranged in a plurality of positions.

In addition, one conductor has a plurality of functions of a wiring, an electrode, a terminal, and the like in some cases. In this specification, a plurality of names are used for the same component in some cases. Furthermore, even in the case where elements are illustrated in a circuit diagram as if they were directly connected to each other, the elements may actually be connected to each other through one conductor or a plurality of conductors. In this specification, even such a structure is included in the category of direct connection.

Embodiment 1

In this embodiment, a display device of one embodiment of the present invention is described with reference to drawings.

One embodiment of the present invention is a display device capable of turning on and turning off a light-emitting device by PAM+PWM control (a pulse width control involving changes in amplitude). The display device writes the same input signal (data potential) to a first node and a second node to turn on the light-emitting device in accordance with a potential of the first node and generate a pulse signal in accordance with a potential of the second node. Then, the potential of the first node is reset in accordance with the generated pulse signal. Therefore, the light-emitting device can emit light for a desired period with a desired emission intensity.

Note that in this embodiment, PAM control means controlling luminance by changing an emission intensity (corresponding to current flowing through the light-emitting device) with a light-emitting time (corresponding to a width of the pulse signal generated in a pixel) fixed. PWM control means controlling luminance by changing the light-emitting time with an emission intensity kept constant. PAM+PWM control means controlling luminance by changing both the light-emitting intensity and the light-emitting time.

An LED, one of light-emitting devices, has the characteristic of changing its chromaticity depending on the current density, and PAM control is not suitable in some cases. On the other hand, PWM control has a problem in that control at a low grayscale level is not easy due to the influence of response characteristics or the like of a driving transistor and an LED. In order to relieve these problems, a display operation in which PWM control and PAM control are combined can be performed in the display device of one embodiment of the present invention.

For example, the display operation can be performed by PAM control at a low grayscale level side and a high grayscale level side and PAM+PWM control at an intermediate grayscale level. Through the operation, it is possible to increase controllability at the low grayscale level side while the amount of change in chromaticity from the intermediate to high grayscale levels is reduced. Note that the display device of one embodiment of the present invention is not limited thereto, and a light-emitting operation of the LED can be performed only by either PAM control or PWM control over a wide range of grayscale levels.

FIG. 1 is a circuit diagram of a pixel 10a included in the display device of one embodiment of the present invention. The pixel 10a includes a pulse signal generation portion 11 and a node N and a node A for retaining a data potential VDATA.

The data potential VDATA is a potential based on image data, and the same data potential VDATA is supplied to both the node N and the node A. A light-emitting device 110 can be turned on in accordance with the data potential VDATA supplied to the node A (PAM control). An input portion of the pulse signal generation portion 11 is electrically connected to the node N, and an output portion of the pulse signal generation portion 11 is electrically connected to the node A. Thus, a potential of the node A can be reset in accordance with the pulse signal generated in the pulse signal generation portion 11, so that the light-emitting device 110 can be turned off (PWM control).

The pixel 10a can include a transistor 101, a transistor 102, a transistor 103, the light-emitting device 110, a capacitor 111, and the pulse signal generation portion 11. An LED (e.g., a micro LED or a mini LED) is preferably used for the light-emitting device 110. Note that an organic EL element can be used as the light-emitting device 110.

Here, the transistors 101 and 102 each function as a switch. The transistor 103 is a p-channel transistor and functions as a driving transistor of the light-emitting device 110. The capacitor 111 functions as a storage capacitor of the node A. Although an example is illustrated where n-channel transistors are used as the transistors 101 and 102, the transistors functioning as switches may be p-channel transistors.

One of a source and a drain of the transistor 101 is electrically connected to one of a source and a drain of the transistor 102 and the input portion of the pulse signal generation portion 11. The other of the source and the drain of the transistor 102 is electrically connected to the output portion of the pulse signal generation portion 11, one electrode of the capacitor 111, and a gate of the transistor 103. One of a source and a drain of the transistor 103 is electrically connected to one electrode (anode) of the light-emitting device 110. The other of the source and the drain of the transistor 103 is electrically connected to the other electrode of the capacitor 111.

Here, a point (e.g., a wiring or an electrode) where the one of the source and the drain of the transistor 101, the one of the source and the drain of the transistor 102, and the input portion of the pulse signal generation portion 11 are connected to each other is referred to as the node N. A point (e.g., a wiring or an electrode) where the other of the source and the drain of the transistor 102, the output portion of the pulse signal generation portion 11, the one electrode of the capacitor 111, and the gate of the transistor 103 are connected to each other is referred to as the node A.

The connection relations between the transistors and wirings are as follows. The other of the source and the drain of the transistor 101 is electrically connected to a wiring 121. The other of the source and the drain of the transistor 103 is electrically connected to a wiring 125. The other electrode (cathode) of the light-emitting device 110 is electrically connected to a wiring 129. A gate of the transistor 101 is electrically connected to a wiring 131. A gate of the transistor 102 is electrically connected to a wiring 132.

The wiring 121 is a source wiring for supplying the data potential VDATA. The wiring 121 can be electrically connected to a source driver. The wirings 125 and 129 are power supply lines: the wiring 125 can be a high potential power supply line and the wiring 129 can be a low potential power supply line. The wirings 131 and 132 are gate wirings for controlling conduction of the transistors and can be electrically connected to a gate driver.

FIG. 2A illustrates a specific circuit structure example of the pulse signal generation portion 11. The pulse signal generation portion 11 can include a transistor 104, a transistor 105, a transistor 106, a transistor 107, a transistor 108, a transistor 109, a capacitor 112, and a capacitor 113.

Here, the transistor 104 is an n-channel transistor and includes a first gate and a second gate. The first gate functions as a front gate, and the second gate functions as a back gate. Here, the transistors 106 and 107 can be p-channel transistors. Note that although FIG. 2A illustrates an example in which n-channel transistors are used as the other transistors, p-channel transistors may be employed.

A first gate of the transistor 104 is electrically connected to the node N, one of a source and a drain of the transistor 105 and one electrode of the capacitor 112. That is, a wiring, an electrode, or the like where the first gate of the transistor 104, the one of the source and the drain of the transistor 105 and the one electrode of the capacitor 112 are connected to each other can be referred to as the input portion of the pulse signal generation portion 11. Alternatively, the node N can be referred to as the input portion of the pulse signal generation portion 11.

One of a source and a drain of the transistor 104 is electrically connected to a gate of the transistor 106 and one of a source and a drain of the transistor 107.

One of a source and a drain of the transistor 106 is electrically connected to the node A. That is, a wiring, an electrode, or the like where the one of the source and the drain of the transistor 106 and the node A are connected to each other can be referred to as the output portion of the pulse signal generation portion 11. Alternatively, the node A can be referred to as the output portion of the pulse signal generation portion 11.

A second gate of the transistor 104 is electrically connected to one of a source and a drain of the transistor 108 and one electrode of the capacitor 113.

The other electrode of the capacitor 113 is electrically connected to the other of the source and the drain of the transistor 105 and one of a source and a drain of the transistor 109.

Here, a point (e.g., a wiring or an electrode) where the one of the source and the drain of the transistor 104, the gate of the transistor 106, and the one of the source and the drain of the transistor 107 are connected to each other is referred to as a node W. A point (e.g., a wiring or an electrode) where the second gate of the transistor 104, the one of the source and the drain of the transistor 108, and the one electrode of the capacitor 113 are connected to each other is referred to as a node BG. A point (e.g., a wiring or an electrode) where the other electrode of the capacitor 113, the other of the source and the drain of the transistor 105, and the one of the source and the drain of the transistor 109 are connected to each other is referred to as a node BS.

The connection relations between the transistors and wirings are as follows. The other of the source and the drain of the transistor 104 and the other of the source and the drain of the transistor 109 are electrically connected to a wiring 122. The other of the source and the drain of the transistor 106 is electrically connected to a wiring 124. The other of the source and the drain of the transistor 107 is electrically connected to a wiring 123. The other of the source and the drain of the transistor 108 is electrically connected to a wiring 128. A gate of the transistor 105 is electrically connected to a wiring 133. A gate of the transistor 107 is electrically connected to a wiring 134. A gate of the transistor 108 is electrically connected to a wiring 135. A gate of the transistor 109 is electrically connected to a wiring 136. The other electrode of the capacitor 112 is electrically connected to a wiring 127.

The wiring 122 is a wiring for supplying a slope potential SLO. Note that in this specification, the slope potential is a type of signal potential with a ramp waveform and refers to a signal potential having a period in which the potential changes from high to low or from low to high. Alternatively, the slope potential refers to a signal potential having a period in which the potential changes so as to have a gradient with respect to the time axis.

The wiring 123 is a wiring for supplying a reset potential VRESW to the node W. The wiring 124 is a wiring for supplying a reset potential VRESA to the node A. The wiring 127 is a fixed potential line, and can be a GND wiring, a low potential power supply line, or the like, for example. The wiring 128 is a wiring for supplying a potential VSBG to the node BG. The potential VSBG is a fixed potential supplied as an initial back gate potential.

Here, the reset potential VRESW supplied to the wiring 123 can be a high potential. The reset potential VRESA supplied to the wiring 124 can be a high potential. The potential VSBG supplied to the wiring 128 can be a low potential (e.g., a negative potential). The details of the slope potential SLO supplied to the wiring 122 will be described later.

The transistors 106 and 107 each function as a switch. The transistors 104, 105, 108, and 109 each have a function of determining the width of the generated pulse signal. The capacitor 112 functions as a storage capacitor of the node N. The capacitor 113 functions as a storage capacitor of the node BG.

In the pulse signal generation portion 11, the transistor 104 is turned on under a certain condition and a potential of the node W is decreased, whereby the transistor 106 can be turned on. When the transistor 106 is turned on, the potential of the node A can be the reset potential VRESA. That is, the pulse signal generation portion 11 can generate a pulse signal and control a period of retaining the data potential VDATA in the node A in accordance with the pulse signal.

As the transistors 101 to 109 included in the pixel 10a, a transistor containing silicon in a channel formation region (hereinafter, referred to as a Si transistor), a transistor containing a metal oxide in a channel formation region (hereinafter, referred to as an OS transistor), or the like can be used. Both the Si transistor and the OS transistor can also be used.

For example, in a circuit structure illustrated in FIG. 2A, the Si transistors are preferably used as the transistors 103, 106, and 107, and the OS transistors are preferably used as the other transistors. The OS transistor can be provided in a step for providing a wiring layer over the Si transistor, whereby the degree of integration can be increased.

The transistors 103, 106, and 107 are preferably Si transistors that can easily be formed as p-channel transistors. In addition, since the transistors 106 and 107 preferably have fast charge characteristics, the transistors 106 and 107 preferably have high mutual conductance (gm). The Si transistor has relatively high mobility and thus can be a transistor having high gm.

In the OS transistor, a semiconductor layer has a large energy gap, and thus the OS transistor can have extremely low off-state current of several yoctoamperes per micrometer (current per micrometer of channel width). Owing to low off-state current, the potential retention capability of the node can be increased; thus, an appropriate image display can be performed even when the frame frequency is decreased. For example, switching between a first frame frequency (for example, higher than or equal to 60 Hz) in moving image display and a second frame frequency that is lower than the first frame frequency (for example, approximately 1 to 10 Hz) in still image display can reduce power consumption of the display device.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS, a CAC-OS, or the like described later can be used, for example. A CAAC-OS has a crystal structure of stable atoms and is suitable for a transistor or the like whose reliability is important. In addition, a CAC-OS exhibits excellent mobility characteristics and thus is suitable for a transistor or the like that is driven at high speed.

Unlike a transistor including silicon in a channel formation region (hereinafter, a Si transistor), an OS transistor has characteristics that impact ionization, an avalanche breakdown, a short-channel effect, and the like do not occur, and thus a highly reliable circuit can be formed.

Examples of the metal oxide that can be used for the semiconductor layer of the OS transistor include indium oxide, gallium oxide, and zinc oxide. The metal oxide preferably contains two or three selected from indium, an element M, and zinc. The element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium. Specifically, the element M is preferably one or more kinds selected from aluminum, gallium, yttrium, and tin.

It is particularly preferable that an oxide containing indium (In), gallium (Ga), and zinc (Zn) (also referred to as IGZO) be used as the metal oxide used for the semiconductor layer. Alternatively, it is preferable to use an oxide containing indium, tin, and zinc (also referred to as ITZO). Further alternatively, it is preferable to use an oxide containing indium, gallium, tin, and zinc. Alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

When the metal oxide used for the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The semiconductor layer may include two or more metal oxide layers having different compositions. For example, a stacked-layer structure of a first metal oxide layer having In:M:Zn=1:3:4 [atomic ratio] or a composition in the neighborhood thereof and a second metal oxide layer having In:M:Zn=1:1:1 [atomic ratio] or a composition in the neighborhood thereof and being formed over the first metal oxide layer can be suitably employed. In particular, gallium or aluminum is preferably used as the element M.

Alternatively, a stacked-layer structure of one selected from indium oxide, indium gallium oxide, and IGZO and one selected from IAZO, IAGZO, and ITZO (registered trademark) may be employed, for example.

Note that the composition is not limited thereto, and an oxide semiconductor having appropriate composition may be used depending on required semiconductor characteristics and electrical characteristics of the transistor (field-effect mobility, threshold voltage, and the like). In addition, to obtain the required semiconductor characteristics of the transistor, it is preferable that the carrier concentration, impurity concentration, defect density, atomic ratio between a metal element and oxygen, interatomic distance, density, and the like of the semiconductor layer be appropriately set.

When silicon or carbon, which is one of the Group 14 elements, is contained in the oxide semiconductor included in the semiconductor layer, oxygen vacancies are increased, and the semiconductor layer becomes n-type. Thus, the concentration (concentration obtained by secondary ion mass spectrometry) of silicon or carbon in the semiconductor layer is set lower than or equal to $2\times 10^{18}$ atoms/cm$^3$, preferably lower than or equal to $2\times10^{17}$ atoms/cm$^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set lower than or equal to $1\times10^{18}$ atoms/cm$^3$, preferably lower than or equal to $2\times10^{16}$ atoms/cm$^3$.

Furthermore, when nitrogen is contained in the oxide semiconductor included the semiconductor layer, electrons serving as carriers are generated and the carrier concentration is increased, whereby the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set lower than or equal to $5 \times 10^{18}$ atoms/cm$^3$.

When hydrogen is contained in the oxide semiconductor included in the semiconductor layer, hydrogen and oxygen which is bonded to a metal atom combine to form water, and thus sometimes an oxygen vacancy is formed in the oxide semiconductor. When the channel formation region in the oxide semiconductor includes oxygen vacancies, the transistor sometimes has normally-on characteristics. In some cases, a defect in which hydrogen has entered an oxygen vacancy functions as a donor and generates an electron serving as a carrier. In other cases, part of hydrogen are combined to oxygen which is bonded to a metal atom and electrons serving as carriers are generated. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration on the assumption that the state where an electric field is not applied is sometimes used as the parameter of the oxide semiconductor, instead of the donor concentration. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. The non-single-crystal structure includes, for example, a CAAC-OS (C-Axis Aligned Crystalline Oxide Semiconductor) including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above-described regions in some cases.

The composition of a CAC (Cloud-Aligned Composite)-OS, which is one embodiment of a non-single-crystal semiconductor layer, is described below.

The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions containing the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that the oxide semiconductor preferably contains at least indium. In particular, indium and zinc are preferably contained. In addition to these, one or more of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as InO$_{X1}$ (X1 is a real number greater than 0)) or indium zinc oxide (hereinafter referred to as In$_{X2}$Zn$_{Y2}$O$_{Z2}$ (each of X2, Y2, and Z2 is a real number greater than 0)), and gallium oxide (hereinafter referred to as GaO$_{X3}$ (X3 is a real number greater than 0)), or gallium zinc oxide (hereinafter referred to as Ga$_{X4}$Zn$_{Y4}$O$_{Z4}$ (each of X4, Y4, and Z4 is a real number greater than 0)), and a mosaic pattern is formed, and mosaic-like InO$_{X1}$ or In$_{X2}$Zn$_{Y2}$O$_{Z2}$ is evenly distributed in the film (this composition is hereinafter also referred to as a cloud-like composition).

That is, the CAC-OS is a composite oxide semiconductor having a composition in which a region where GaO$_{X3}$ is a main component and a region where In$_{X2}$Zn$_{Y2}$O$_{Z2}$ or InO$_{X1}$ is a main component are mixed. Note that in this specification, for example, when the atomic ratio of In to the element M in a first region is greater than the atomic ratio of In to the element M in a second region, the first region is regarded as having a higher In concentration than the second region.

Note that IGZO is a common name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1 \le x0 \le 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of an oxide semiconductor. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Thus, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, or the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where intentional heating is not performed on a substrate, for example. In the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using $\theta/2\theta$ scan by an Out-of-plane method, which is one of the X-ray diffraction (XRD) measurement methods. That is, it is found from X-ray diffraction measurement that no alignment in an a-b plane direction and a c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. It is therefore found from the electron diffraction pattern that the crystal structure of the CAC-OS includes an nc (nano-crystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions containing the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through the regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility ($\mu$) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when the regions including $GaO_{X3}$ or the like as a main component are distributed in an oxide semiconductor, leakage current can be reduced and favorable switching operation can be achieved.

Accordingly, when the CAC-OS is used for a semiconductor device, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor device using the CAC-OS has high reliability. Thus, the CAC-OS is suitable for a constituent material of a variety of semiconductor apparatuses.

At least one of the transistor 102 to the transistor 105 may be an OS transistor. Alternatively, at least one of the transistor 102 to the transistor 105 may be a transistor containing silicon in a channel formation region (hereinafter, a Si transistor).

Amorphous silicon, microcrystalline silicon, polycrystalline silicon, single crystal silicon, or the like can be used for the channel formation region of the Si transistor. Note that polycrystalline silicon is preferably used in the case where a transistor is provided over an insulating surface of a glass substrate or the like.

High-quality polycrystalline silicon can be obtained easily by using a laser crystallization step or the like. The high-quality polycrystalline silicon can also be obtained by a solid-phase growth method in which a metal catalyst such as nickel or palladium is added to amorphous silicon and then heated. Crystallinity may be further increased by laser irradiation on the polycrystalline silicon formed by the solid-phase growth method using a metal catalyst. Note that the metal catalyst remains in the polycrystalline silicon and worsens electrical characteristics of the transistor; therefore, it is preferable to provide a region to which phosphorus, a noble gas, or the like is added other than the channel formation region, in which case the region captures the metal catalyst.

Note that structures by which the effect of one embodiment of the present invention is obtained are not limited to those described above: Si transistors may be used as all the transistors included in the pixel. One or more of the transistors included in the pixel may be p-channel transistors.

Figure 3A:
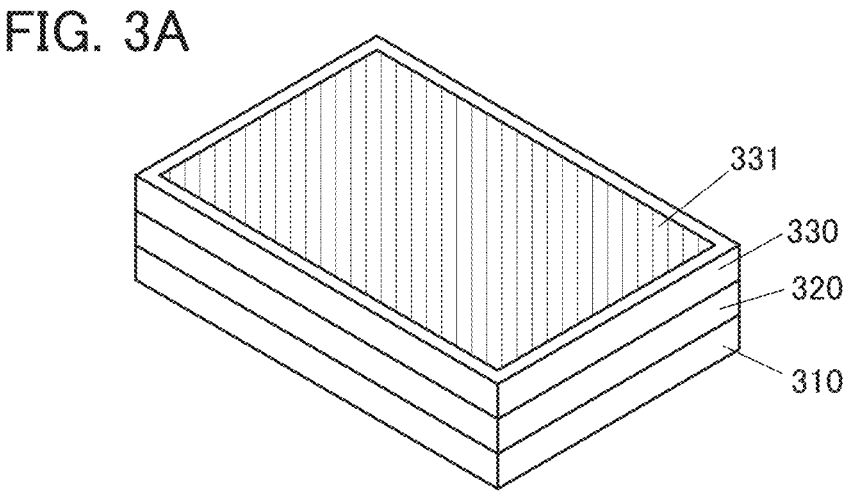
FIG. 3A and FIG. 3B are diagrams illustrating a stacked-layer structure of a display device.
Figure 3B:
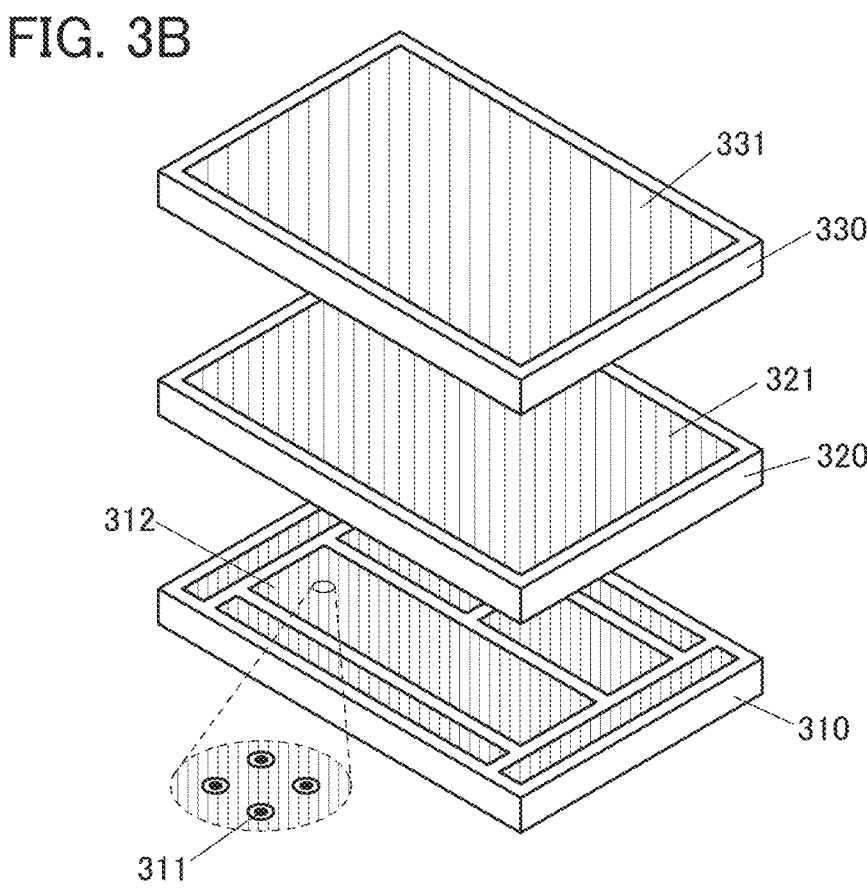

FIG. 3A is a diagram illustrating an example of a display device having a stacked-layer structure, and FIG. 3B is a developed view and an enlarged view of part of the display device. In the display device having a stacked-layer structure, a layer 310 including a silicon substrate or the like, a layer 320 including a wiring or the like, and a layer 330 including a light-emitting device may be stacked in this order. In the stacked-layer structure, circuits can be formed so as to overlap with each other and thus the display device can have a narrow bezel.

The layer 310 can include a Si transistor 311 and a functional circuit 312 which are components of a pixel circuit. Note that the Si transistor 311 can be positioned in a region that does not interfere with the functional circuit 312. The Si transistor 311 corresponds to the transistors 103, 106, and 107 in FIG. 2A, for example. The layer 320 can include an OS transistor 321 which is a component of the pixel circuit. The layer 330 can include an LED array 331.

The LED array 331 has a structure in which LEDs are arranged in a matrix. As the LED, for example, a micro LED whose diameter or length of one side is less than or equal to 50 μm or a mini LED whose diameter or length of one side is greater than 50 μm and less than or equal to 200 μm can be used.

As the functional circuit 312, any one or more of a source driver, a gate driver, a memory circuit, an arithmetic circuit, and a power supply circuit can be provided, for example. As the functional circuit 312, the pulse signal generation portion included in the pixel 10*a* may be provided. Part or the whole of the gate driver and the memory circuit can also be formed using an OS transistor. Details of the stacked-layer structure will be described in Embodiment 2.

Next, the operation of the transistor 104 will be described with reference to FIG. 2B to FIG. 2D. The transistor 104 includes the first gate and the second gate, and the threshold voltage ($V_{th}$) can be shifted by supplying an appropriate potential to the second gate. In the transistor 104, $V_{th}$ can be shifted in accordance with the data potential VDATA supplied as image data, and the conduction timing can be controlled by the slope potential SLO supplied to the source.

In other words, the conduction timing of the transistor 104 can be changed in accordance with the level of the data potential VDATA. By the operation, switching to PAM control at the low grayscale level and the high grayscale level and PAM+PWM control at the intermediate grayscale level can be performed. The details of an effect of switching control methods depending on the grayscale level will be described later.

FIG. 2B is a timing chart illustrating a potential (Vbg) applied to the second gate of the transistor 104 (node BG). Here, as illustrated in FIG. 2C, a signal potential with a ramp waveform that changes from the upper end (SLO_H) to the lower end (SLO_L) over time is used as the slope potential SLO supplied to the wiring 122. The relationship between the data potential VDATA supplied to the wiring 121 and the slope potential SLO is SLO_H>VDATA>SLO_L. First, a high potential at which a transistor is turned on is supplied to each of the wirings 131, 133, and 135, so that the transistor 101, the transistor 105, and the transistor 108 are turned on.

At this time, a potential of the node BS is VDATA, and a potential of the node BG is VSBG. The wiring 122 is in a standby state supplying the potential SOL_H, which is the upper end potential of the slope potential SLO, and the second gate-source voltage (Vbgs) of the transistor 104 becomes VSBG-SLO_H.

Subsequently, the transistor 101, the transistor 105, and the transistor 108 are turned off, and a high potential at which a transistor is turned on is supplied to the wiring 136, so that the transistor 109 is turned on.

The supply of the slope potential SLO is started at this timing, so that the potential of the node BS becomes SLO. At this time, the potential of the node BG is VSBG-VDATA+SLO by capacitive coupling of the capacitor 113, and the potential of the node BG in the initial period of supplying the slope potential SLO can be regarded as VSBG-VDATA+SLO_H.

After that, the potential of the node BG is decreased in accordance with the slope potential SLO. Note that as illustrated in FIG. 2D, the slope potential SLO is also supplied to the source of the transistor 104. Accordingly, Vbgs of the transistor 104 becomes VSBG-VDATA+SLO-SLO=VSBG-VDATA, and is constant regardless of the level of the slope potential SLO that changes over time.

Thus, $V_{th}$ of the transistor 104 can be shifted by a certain amount in accordance with the level of the data potential VDATA. In the pulse signal generation portion 11, the width of the generated pulse signal can be controlled using the $V_{th}$ shift in accordance with the level of the data potential VDATA.

Next, the operations of the pixel 10*a* are described separately for different grayscale levels. As the data potential VDATA described below, VDATA1 for a low grayscale level, VDATA2 for an intermediate grayscale level, and VDATA3 for a high grayscale level are used. Note that since a p-channel transistor is used as the transistor 103, which is the driving transistor of the light-emitting device 110, the potential levels satisfy VDATA1>VDATA2>VDATA3.

For example, VDATA1 is a data potential for turning on the light-emitting device 110 in a range of grayscale levels from the grayscale level of 0 to the grayscale level lower than the lower end of the intermediate grayscale levels in an 8-bit grayscale. VDATA2 is a data potential for turning on the light-emitting device 110 in a range from the lower end to the upper end of the intermediate grayscale levels. VDATA3 is a data potential for turning on the light-emitting device 110 in a range from the grayscale level higher than the upper end of the intermediate grayscale levels to a grayscale level of 255. Here, the range of the intermediate grayscale levels can be set freely, and for example, can be the range from a grayscale level of 32 to a grayscale level of 127.

Figures 4A, 4B:
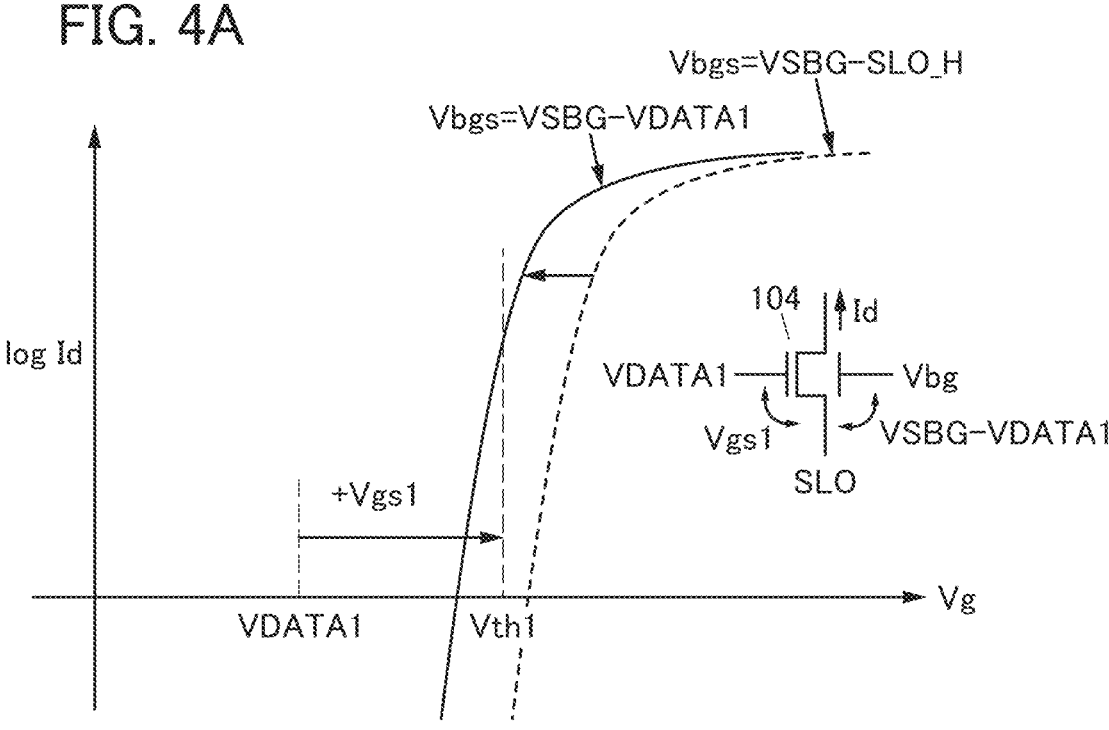
FIG. 4A and FIG. 4B are diagrams each illustrating the operation of a pixel.

FIG. 4A is a diagram showing the transistor 104 and drain current-gate voltage ($I_d$-$V_g$) characteristics thereof in the case where the light-emitting device 110 is turned on using VDATA1 for a data potential in a low grayscale level.

First, when the potential VSBG is supplied to the node BG of the transistor 104 and Vbgs=VSBG-SLO_H is satisfied, the $I_d$-$V_g$ curve of the transistor 104 shifts in the positive direction from the initial position (not illustrated) to the position denoted by a dashed line. After that, when Vbgs=VSBG-VDATA1 is satisfied by capacitive coupling of the capacitor 113, the $I_d$-$V_g$ curve of the transistor 104 shifts in the negative direction and is fixed at the position denoted by a solid line. The change in Vbgs is described in detail in the description of the operation of the pixel 10*a*, described later.

FIG. 4A shows the data potential VDATA1 applied at this time to the first gate of the transistor 104 and the threshold voltage ($V_{th}$1), and indicates that the transistor 104 is turned on when $V_{gs}$ increases by +$V_{gs}$1 or more.

In the transistor 104, a potential applied to the first gate is fixed to VDATA and $V_{gs}$ is changed by supplying the slope potential SLO that sweeps from the high potential to the low potential to the source.

FIG. 4B is a diagram illustrating a relation between the slope potential SLO, the data potential VDATA1, and a lighting period of the light-emitting device 110.

The data potential VDATA1 is a value close to the vicinity of the upper end of the slope potential SLO (SLO_H), and when SLO=VDATA1, $V_{gs}$=0. When the slope potential SLO decreases such that $V_{gs}$ further increases by +$V_{gs}$1 from this state, $V_g$ of the transistor 104 reaches $V_{th}$1, so that the transistor 104 is turned on.

The light-emitting device 110 starts lighting after the reset operation of the node N and the node W and writing a data potential DATA1 to the node A. After that, lighting of the light-emitting device 110 continues until the transistor 104 is turned on. When the transistor 104 is turned on, the potential of the node W decreases and the transistor 107 is turned on, so that the potential of the node A can be set from DATA1 to the reset potential VRESA. Thus, the light-emitting device 110 is turned off.

As illustrated in FIG. 4B, the transistor 104 is turned on just before the slope potential SLO reaches the lower end SLO_L. In order to perform such operation, the relation between the slope potential SLO, the data potential VDATA1, the shift amount of $V_{th}1$, and the like is adjusted, whereby the light-emitting device 110 can emit light for most of a frame period. That is, it can be said that PAM control is performed when VDATA1 is used as a data potential.

Figures 5A, 5B:
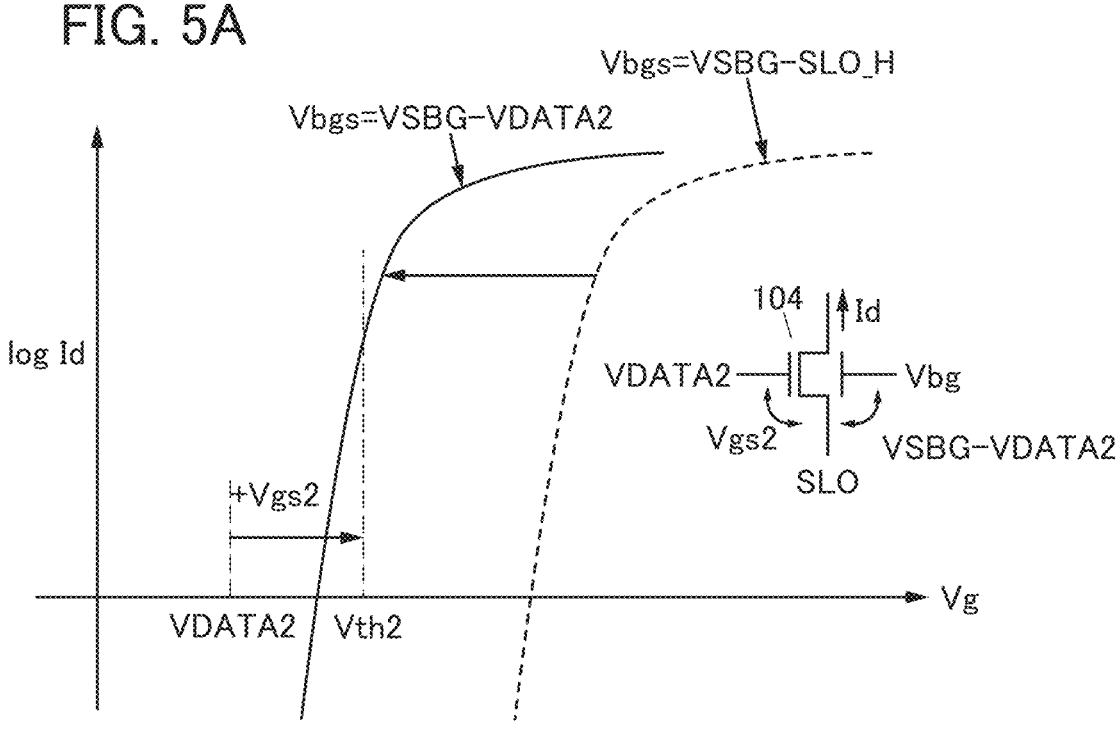
FIG. 5A and FIG. 5B are diagrams each illustrating the operation of a pixel.

FIG. 5A is a diagram showing the transistor 104 and drain current-gate voltage ($I_d$-$V_g$) characteristics in the case where the light-emitting device 110 is turned on using VDATA2 as a data potential for an intermediate grayscale level.

First, when the potential VSBG is supplied to the node BG of the transistor 104 and Vbgs=VSBG−SLO_H is satisfied, the $I_d$-$V_g$ curve of the transistor 104 shifts in the positive direction from the initial position (not illustrated) to the position denoted by a dashed line. After that, when Vbgs=VSBG−VDATA2 is satisfied by capacitive coupling of the capacitor 113, the $I_d$-$V_g$ curve of the transistor 104 shifts in the negative direction and is fixed at the position denoted by a solid line.

FIG. 5A shows the data potential VDATA2 applied at this time to the first gate of the transistor 104 and the threshold voltage ($V_{th}2$), and indicates that the transistor 104 is turned on when $V_{gs}$ further increases by +$V_{gs}2$ or more.

In the transistor 104, the potential applied to the first gate is fixed to VDATA2 and $V_{gs}$ is changed by supplying the slope potential SLO that sweeps from the high potential to the low potential to the source.

FIG. 5B is a diagram illustrating a relation between the slope potential SLO, the data potential VDATA2, and the lighting period of the light-emitting device 110.

The data potential VDATA2 is a value smaller than VDATA1, and when SLO=VDATA2, $V_{gs}$=0. Here, when the SLO decreases such that $V_{gs}$ increases by +$V_{gs}2$ from this state, Vg of the transistor 104 reaches $V_{th}2$, so that the transistor 104 is turned on.

The light-emitting device 110 starts lighting after the reset operation of the node N and the node W and writing a data potential DATA2 to the node A. After that, lighting of the light-emitting device 110 continues until the transistor 104 is turned on. When the transistor 104 is turned on, the potential of the node W decreases and the transistor 107 is turned on, so that the potential of the node A can be set from DATA2 to the reset potential VRESA. Thus, the light-emitting device 110 is turned off.

As illustrated in FIG. 5B, the transistor 104 is turned on in the middle of decrease of the slope potential SLO. In order to perform such operation, the relation between the slope potential SLO, the data potential VDATA2, the shift amount of $V_{th}2$, and the like is adjusted, whereby the light-emitting device 110 can be turned off in the middle of the frame period. In other words, since the light-emitting device 110 is controlled to have a short lighting period, in addition to being made to emit light by applying the data potential DATA2, it can be said PAM+PWM control is performed in the case where VDATA2 is used as a data potential.

Figures 6A, 6B:
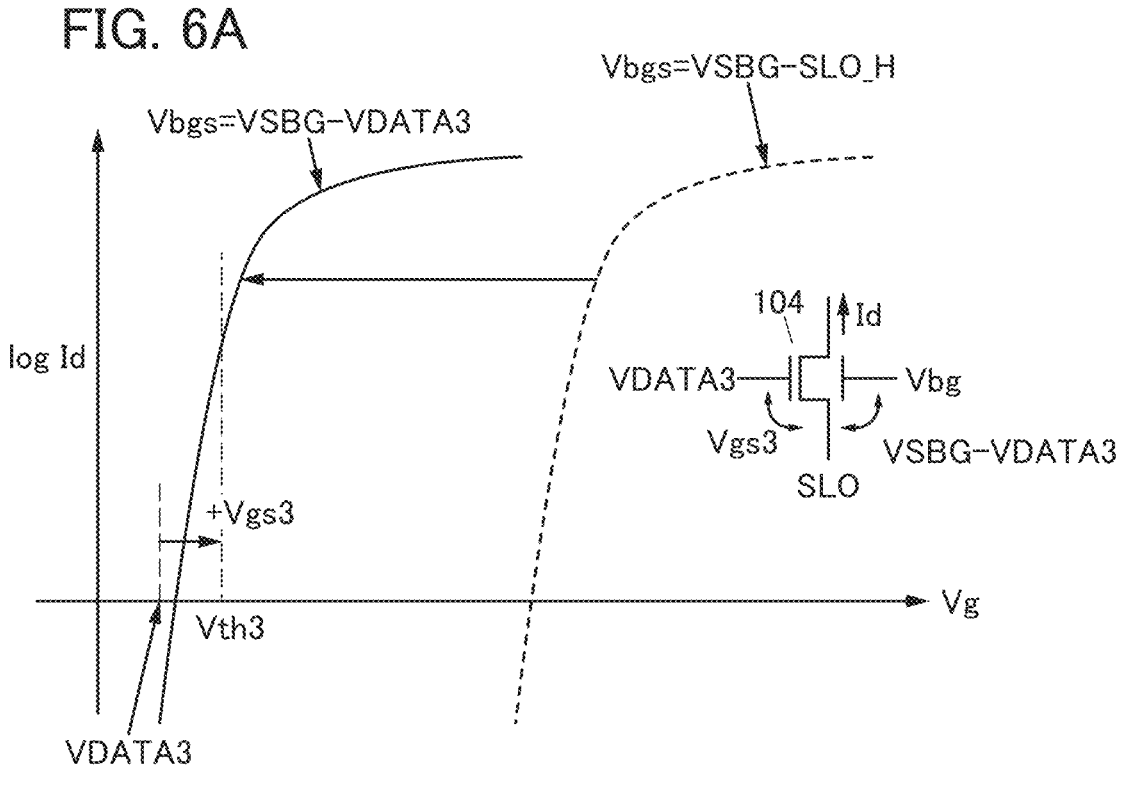
FIG. 6A and FIG. 6B are diagrams each illustrating the operation of a pixel.

FIG. 6A is a diagram showing the transistor 104 and drain current-gate voltage ($I_d$-$V_g$) characteristics in the case where the light-emitting device 110 is turned on using VDATA3 as a data potential for a high grayscale level.

First, when the potential VSBG is supplied to the node BG of the transistor 104 and Vbgs=VSBG−SLO_H is satisfied, the $I_d$-$V_g$ curve of the transistor 104 shifts in the positive direction from the initial position (not illustrated) to the position denoted by a dashed line. After that, when Vbgs=VSBG−VDATA1 is satisfied by capacitive coupling of the capacitor 113, the $I_d$-$V_g$ curve of the transistor 104 shifts in the negative direction and is fixed at the position denoted by a solid line.

FIG. 6A shows the data potential VDATA3 applied to the first gate of the transistor 104 and the threshold voltage ($V_{th}3$), and indicates that the transistor 104 is turned on when $V_{gs}$ further increases by +$V_{gs}3$ or more.

In the transistor 104, the potential applied to the first gate is fixed to VDATA3 and $V_{gs}$ is changed by supplying the slope potential SLO that sweeps from the high potential to the low potential to the source.

FIG. 6B is a diagram illustrating a relation between the slope potential SLO, the data potential VDATA3, and the lighting period of the light-emitting device 110.

The data potential VDATA3 is a value close to the vicinity of the upper end of the slope potential SLO (SLO_H), and when SLO=VDATA1, $V_{gs}$=0. When the SLO decreases such that $V_{gs}$ increases by +$V_{gs}3$ from this state, Vg of the transistor 104 reaches $V_{th}3$, so that the transistor 104 is turned on.

The light-emitting device 110 starts lighting after the reset operation of the node N and the node W and writing the data potential DATA3 to the node A. After that, lighting of the light-emitting device 110 continues until the transistor 104 is turned on. When the transistor 104 is turned on, the potential of the node W decreases and the transistor 107 is turned on, so that the potential of the node A can be set from DATA3 to the reset potential VRESA. Thus, the light-emitting device 110 is turned off.

As illustrated in FIG. 6B, the transistor 104 is turned on just before the slope potential SLO reaches the lower end SLO_L. In order to perform such operation, the relation between the slope potential SLO, the data potential VDATA3, the shift amount of $V_{th}3$, and the like is adjusted, whereby the light-emitting device 110 can emit light for most of the frame period. That is, it can be said that PAM control is performed when VDATA3 is used as a data potential.

Next, the operation of the pixel 10a in the case of using the data potential VDATA2 for the intermediate grayscale level is described with reference to a timing chart illustrated in FIG. 7 and diagrams illustrating the circuit operation in FIG. 8A to FIG. 9B. In FIG. 8A to FIG. 9B, the dashed arrows denote the potential supplied to the circuit and the dotted arrows denote the current flowing through the light-emitting device 110 ($I_{LED}$).

First, a low potential ("L") is supplied to the wirings 131, 132, 133, 134, 135, and 136 at Time T1. At this time, the transistor 107 is turned on and the reset potential VRESW (low potential) supplied to the wiring 123 is supplied to the node W (see FIG. 8A). The operation is the reset operation of the node W, and the transistor 106 is turned off at this time.

A high potential ("H") is supplied to the wirings 131, 132, 133, 134, and 135 and the low potential ("L") is supplied to the wiring 136 at Time T2. At this time, the transistor 107 is turned off. Furthermore, the transistors 101, 102, and 105 are turned on and the data potential VDATA2 is supplied to the node N, the node BS, and the node A. Then, the transistor 103 is turned on and the light-emitting device 110 is turned on in accordance with the data potential VDATA2 (see FIG. 8B).

The transistor 108 is turned on and the potential VSBG (low potential) supplied to the wiring 128 is supplied to the node BG. At this time, the wiring 122 is supplied with the same potential as the upper end of the slope potential SLO (SLO_H), and Vbgs of the transistor 104 becomes VSBG–SLO_H. Here, since VSBG<SLO_H, the Id-Vg characteristics of the transistor 104 greatly shifts in the positive direction like the Id-Vg curve denoted by the dashed line in FIG. 5A.

The low potential ("L") is supplied to the wirings 131, 132, 133, and 135 and a high potential ("H") is supplied to the wirings 134 and 136 at Time T3. At this time, the transistors 101, 102, 105, and 108 are turned off, and the transistor 109 is turned on (see FIG. 9A).

The slope potential SLO is supplied to the wiring 122 from Time T3 to Time T10. Here, since the potential of the node BS is rewritten from VDATA2 to SLO, the potential of the node BG becomes VSBG–VDATA2+SLO by capacitive coupling of the capacitor 113.

The slope potential SLO is also supplied to the source of the transistor 104. Thus, Vbgs of the transistor 104 becomes VSBG–VDATA2+SLO–SLO=VSBG–VDATA2 and is a constant value independent of the slope potential SLO. Accordingly, the Id-Vg characteristics of the transistor 104 shift in the negative direction and is fixed like the Id-Vg curve denoted by the dashed line in FIG. 5A.

Figure 9A:
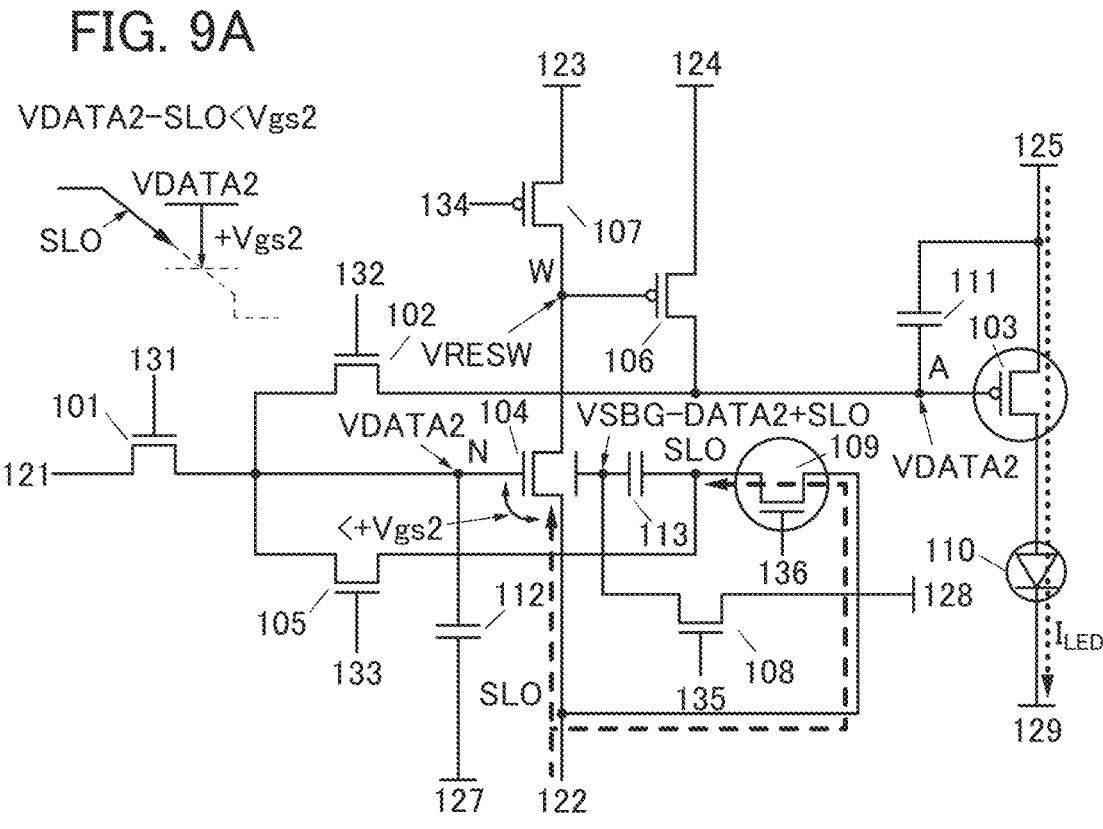
FIG. 9A and FIG. 9B are diagrams each illustrating the operation of a pixel.

The transistor 104 is not turned on until increase in $V_{gs}$ due to decrease in the slope potential SLO reaches $+V_{gs}2$ (see FIG. 5A and FIG. 5B). FIG. 9A illustrates a state before increase in $V_{gs}$ reaches $+V_{gs}2$ (VDATA2–SLO<$+V_{gs}2$), and lighting of the light-emitting device 110 continues during this state.

Figure 9B:
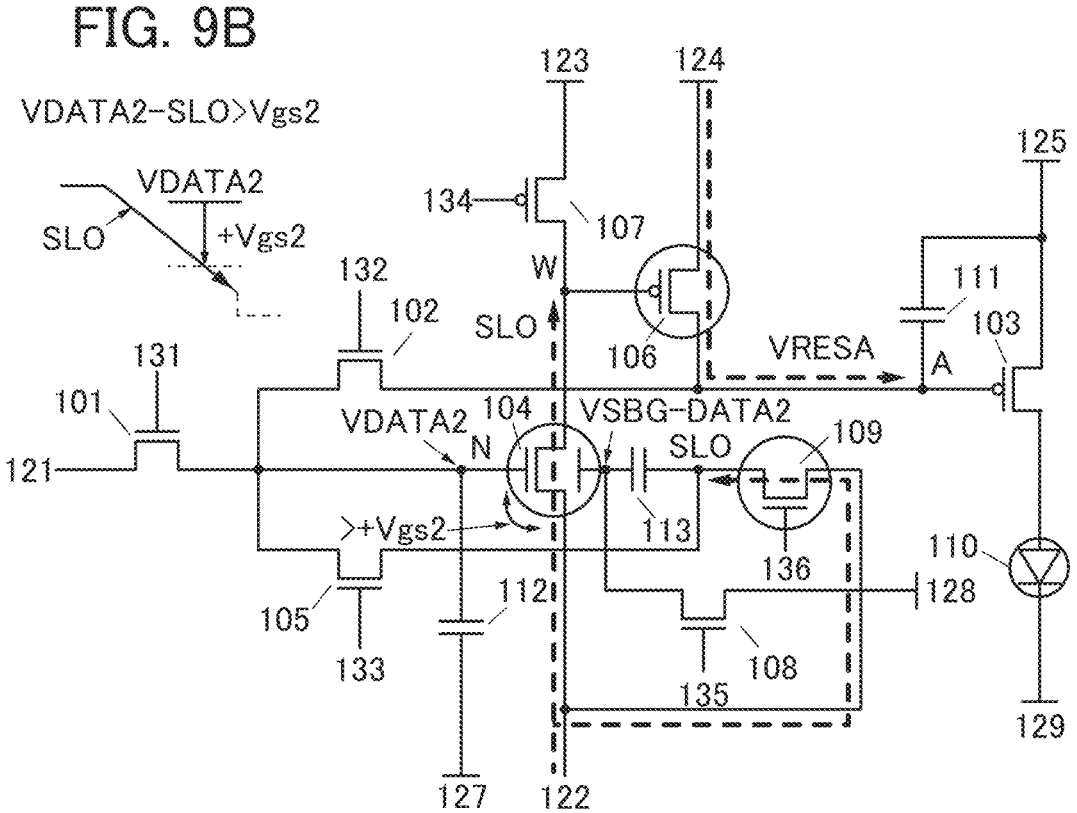

FIG. 9B illustrates a state where increase in $V_{gs}$ is larger than $+V_{gs}2$ at Time T8 (VDATA2–SLO>$+V_{gs}2$) as an example, and in the state, the transistor 104 is turned on and the potential of the node W decreases to SLO, whereby the transistor 106 is turned on. Then, the reset potential VRESA (high potential) supplied to the wiring 124 is supplied to the node A, so that the transistor 103 is turned off, and the light-emitting device 110 is turned off.

As described above, PAM+PWM control can be performed by using the data potential DATA2 such that the light-emitting device 110 is turned off in the middle of decrease of the slope potential SLO.

Figure 10:
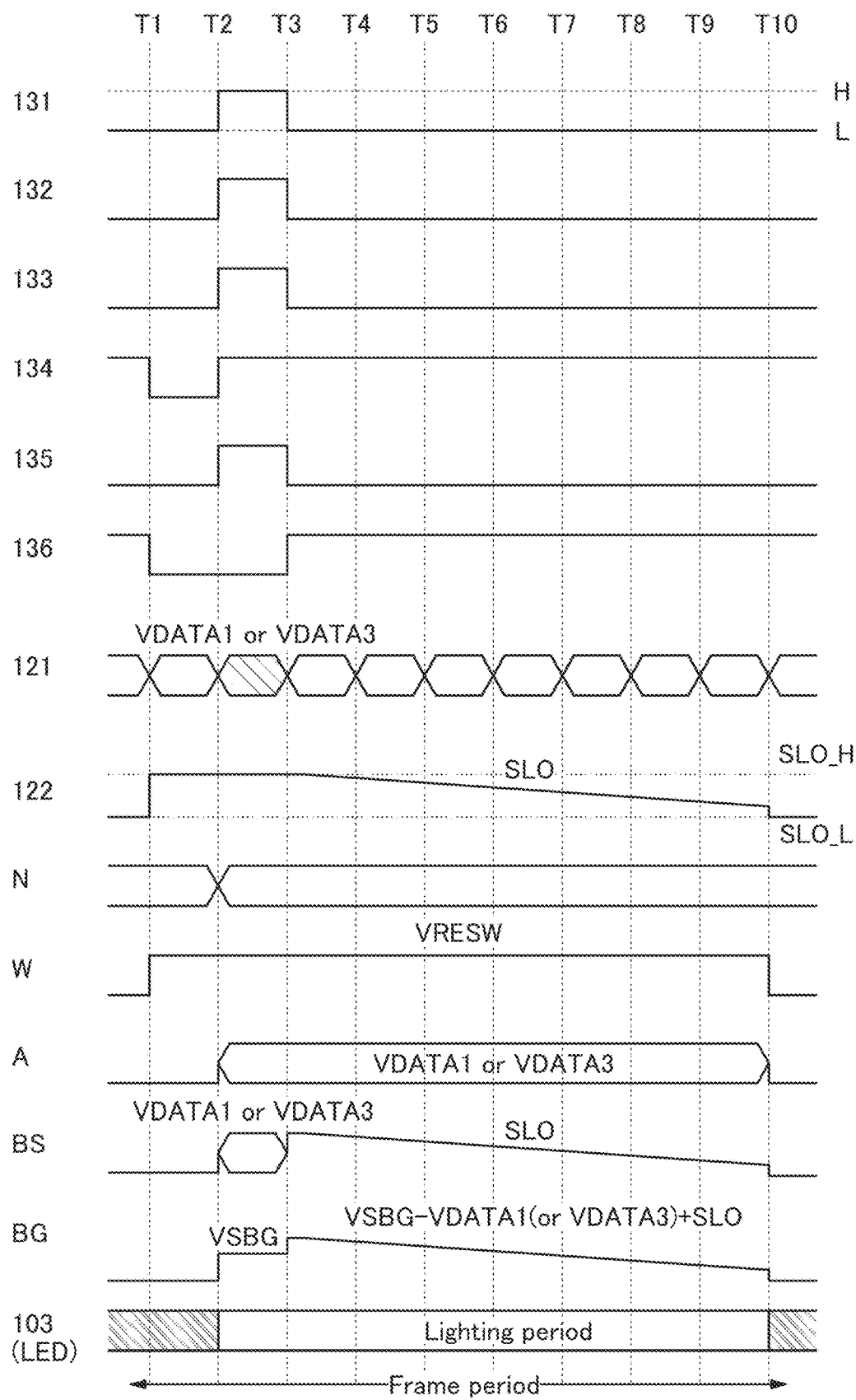
FIG. 10 is a timing chart illustrating the operation of a pixel.

FIG. 10 is a timing chart illustrating the operation of the pixel 10*a* in the case of using the data potential VDATA1 for the low grayscale level or the data potential VDATA3 for the high grayscale level.

Figure 7:
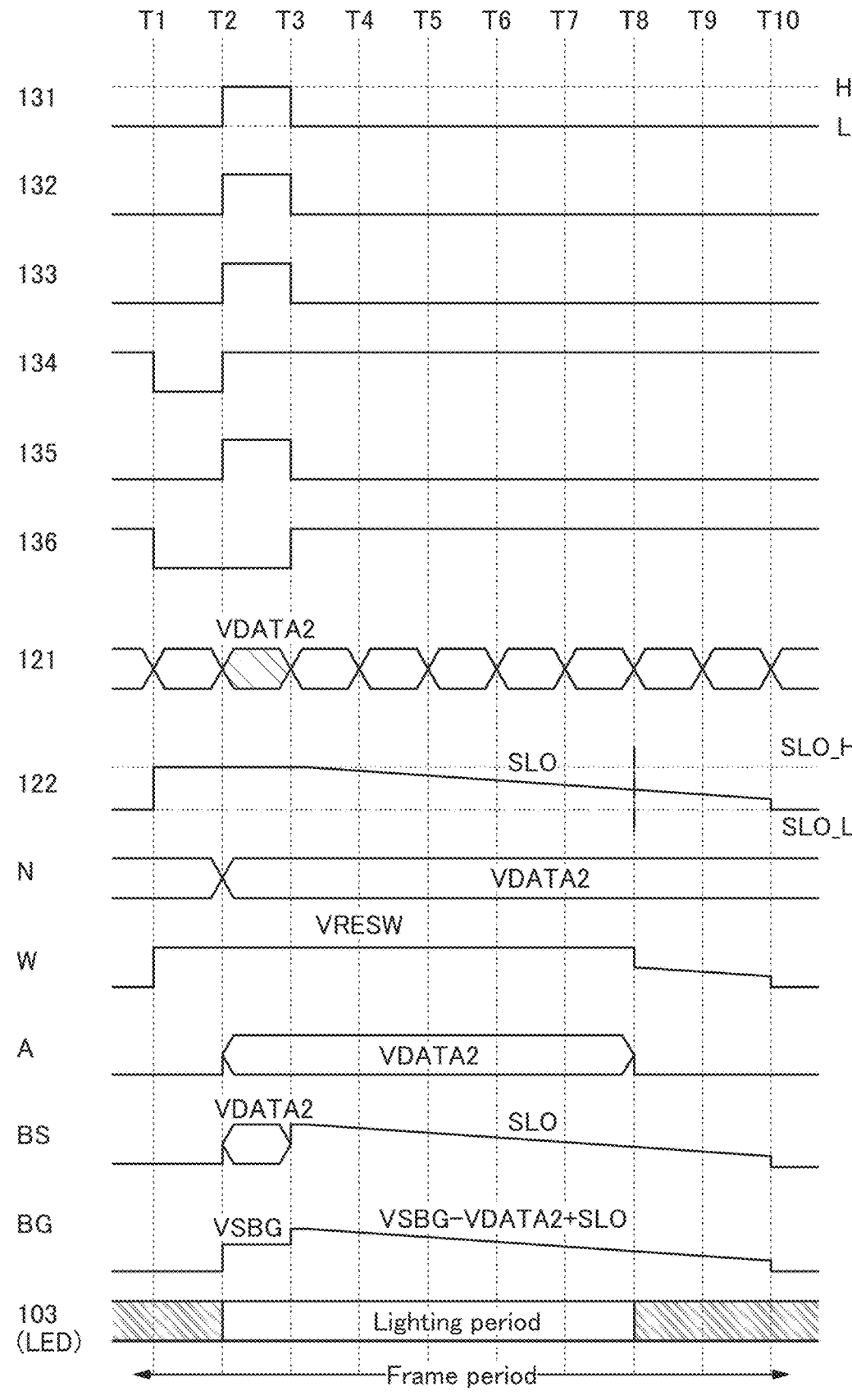
FIG. 7 is a timing chart illustrating the operation of a pixel.
Figure 8A:
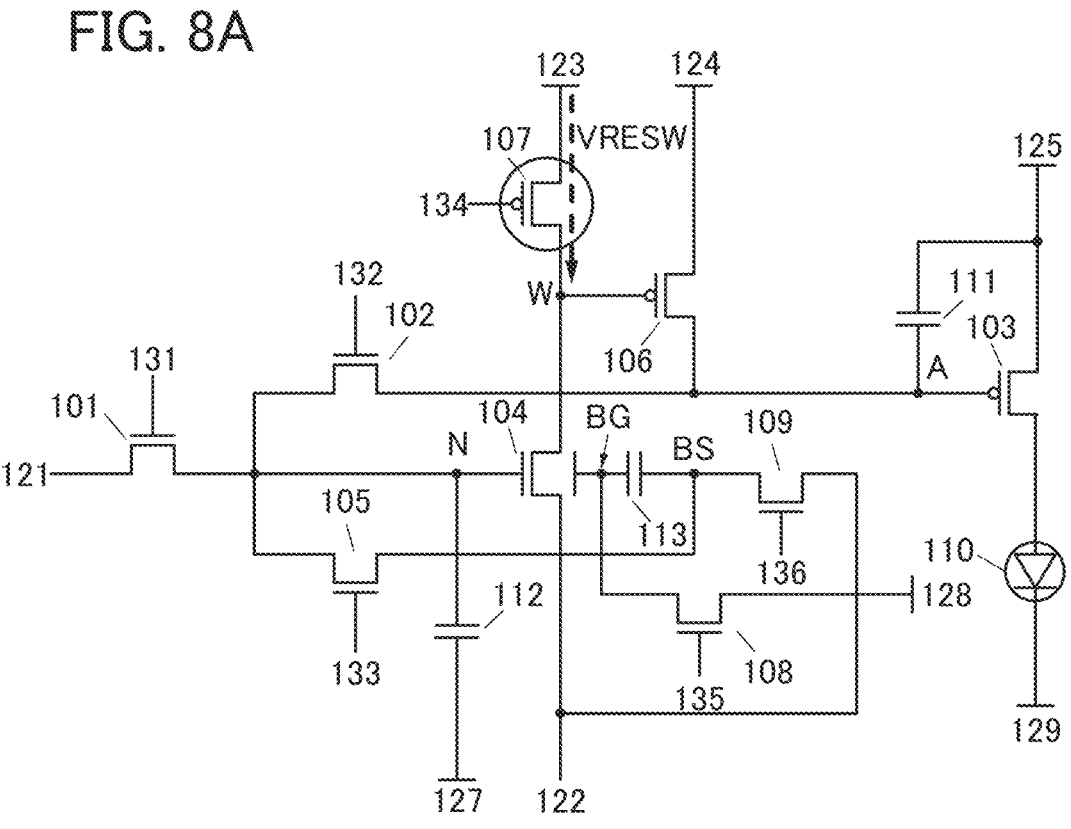
FIG. 8A and FIG. 8B are diagrams each illustrating the operation of a pixel.
Figure 8B:
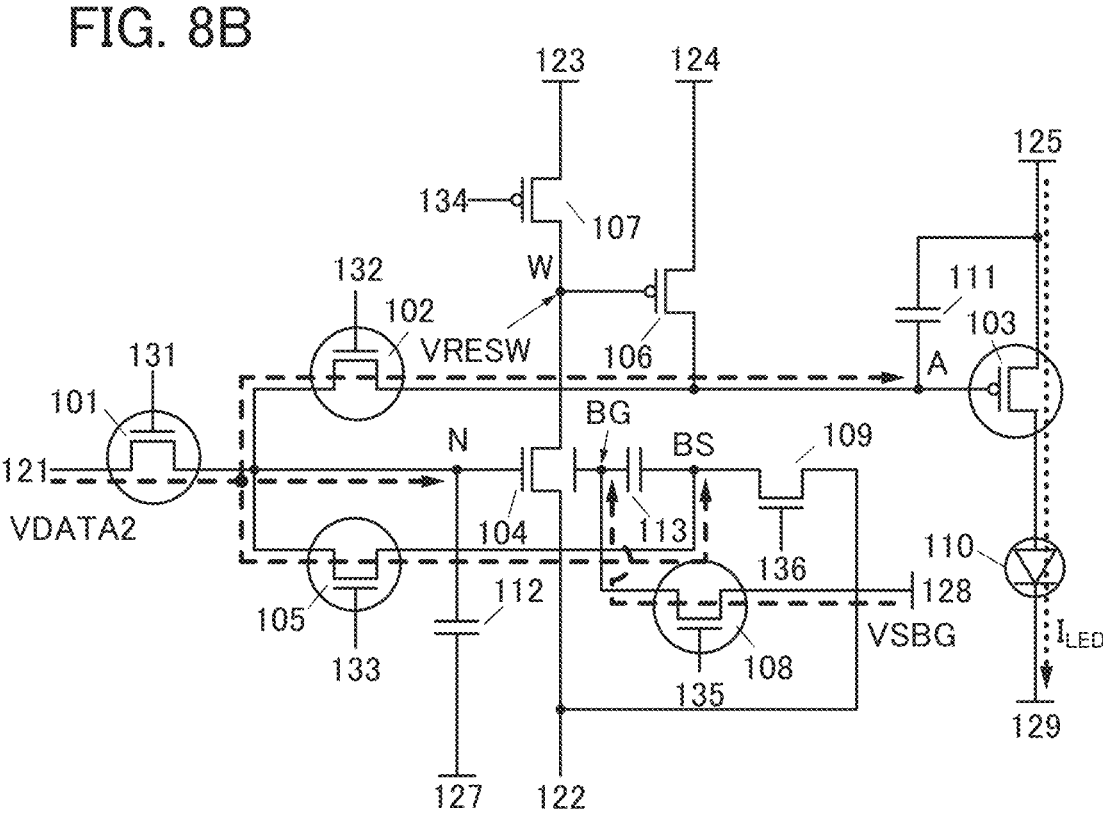

FIG. 10 is different from FIG. 7 in that VDATA1 or VDATA3 is used as a data potential, and the transistor 104 is not turned on and the lighting of the light-emitting device 110 continues until the slope potential SLO reaches the lower end SLO_L or the vicinity thereof. Thus, it can be said the light-emitting device 110 performs PAM control because of emitting light in most of the frame period.

Note that unlike in the above operation, the pixel 10*a* can also perform PAM control or PWM control for all grayscale levels.

For example, the light-emitting device 110 can be turned on only by PWM control when the operation of not turning on the transistor 102 is performed by supplying the reset potential VRESA to the node A.

In addition, when the operation of not turning on the transistor 104 is performed by supplying a high potential (e.g., a potential substantially equal to SLO_H) constantly instead of the slope potential SLO, the transistor 106 is always turned off; therefore, the light-emitting device 110 can be turned on only by PAM control.

Figure 11A:
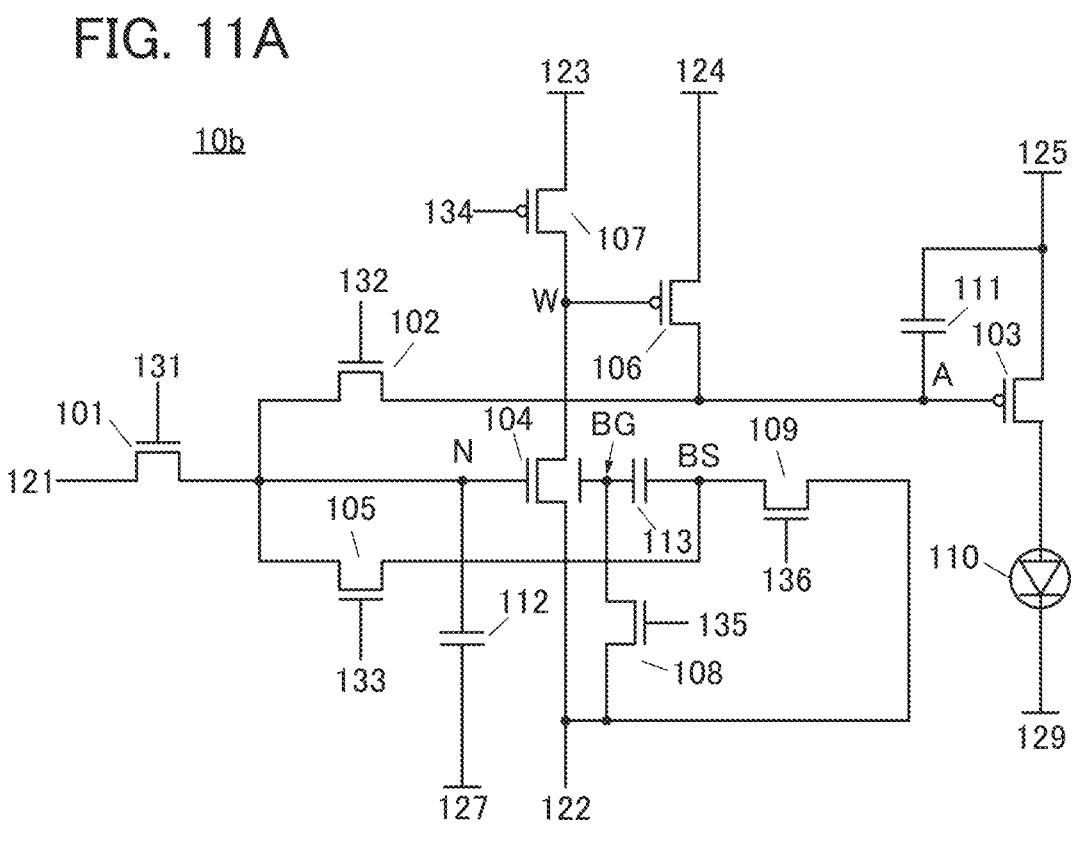
FIG. 11A and FIG. 11B are diagrams illustrating variation examples of a pixel.

Note that the pixel of one embodiment of the present invention may have a structure of a pixel 10*b* illustrated in FIG. 11A. The structure illustrated in FIG. 11A is different from the pixel 10*a* illustrated in FIG. 2A in that the other of the source and the drain of the transistor 108 is electrically connected to the wiring 122.

Although the pixel 10*a* is an example in which VSBG is supplied to the node BG from the wiring 128 as the initial back gate potential, the slope potential SLO is supplied in the pixel 10*b*. In this case, the initial level of the slope potential is preferably a low potential at which the transistor 104 is not turned on. With this structure, the wiring 128 can be eliminated.

Figure 11B:
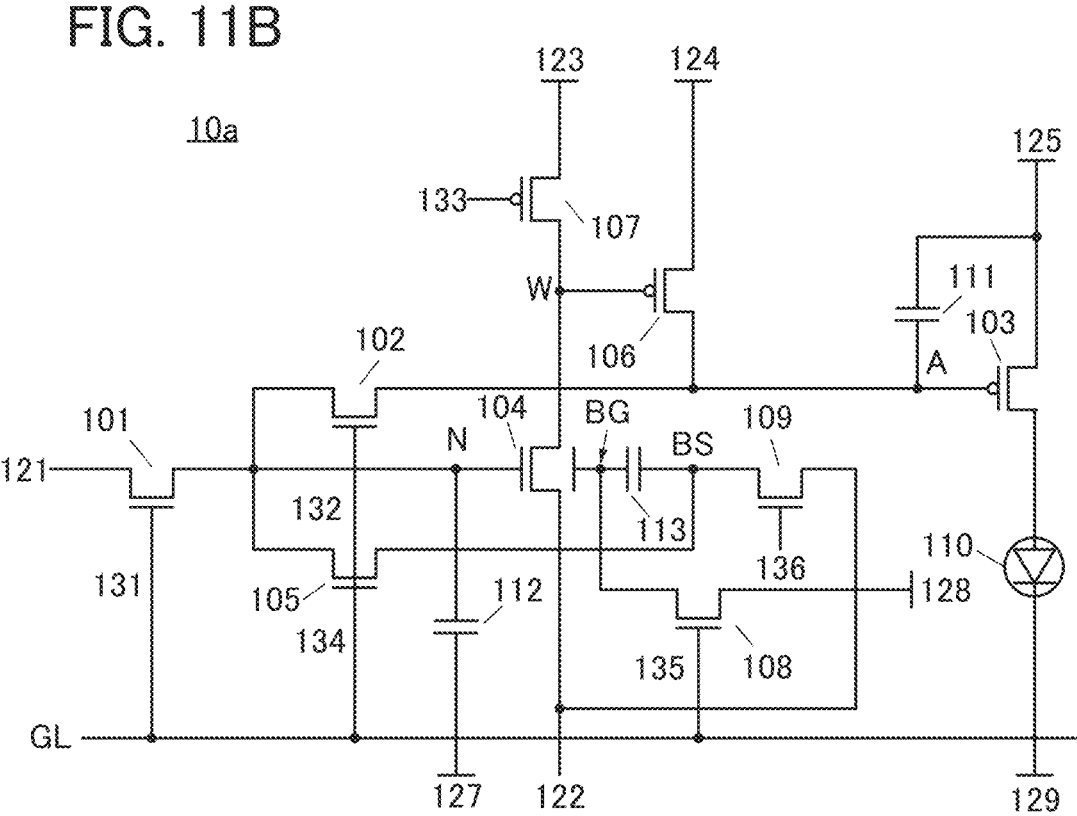

As illustrated in FIG. 11B, the wirings 131, 132, 133, and 135 may be connected to a common gate line GL. As illustrated in the timing charts in FIG. 7 and FIG. 10, the same potential can be supplied to these wirings at the same timing; thus, they can be a common wiring. Note that although FIG. 11B illustrates the structure example of the pixel 10*a*, the common gate line GL can also be used in pixels with other structures described in this embodiment.

Figure 12A:
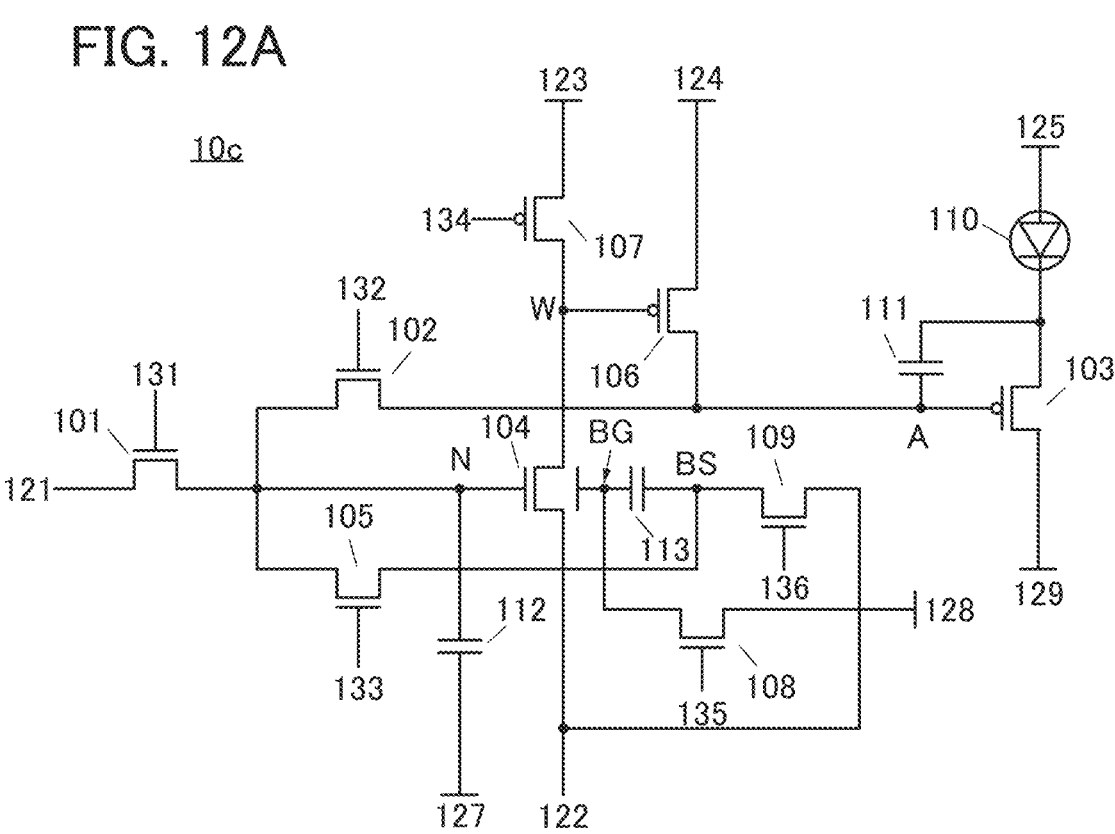
FIG. 12A and FIG. 12B are diagrams illustrating variation examples of a pixel.

As in a pixel 10*c* illustrated in FIG. 12A, one electrode (anode) of the light-emitting device may be electrically connected to the wiring 125, and the other electrode (cathode) may be electrically connected to the other of the source and the drain of the transistor 103. The structures of the pixel 10*a* and the pixel 10*c* can be selected individually depending on the specification of the terminal used in the light-emitting device 110.

Figure 12B:
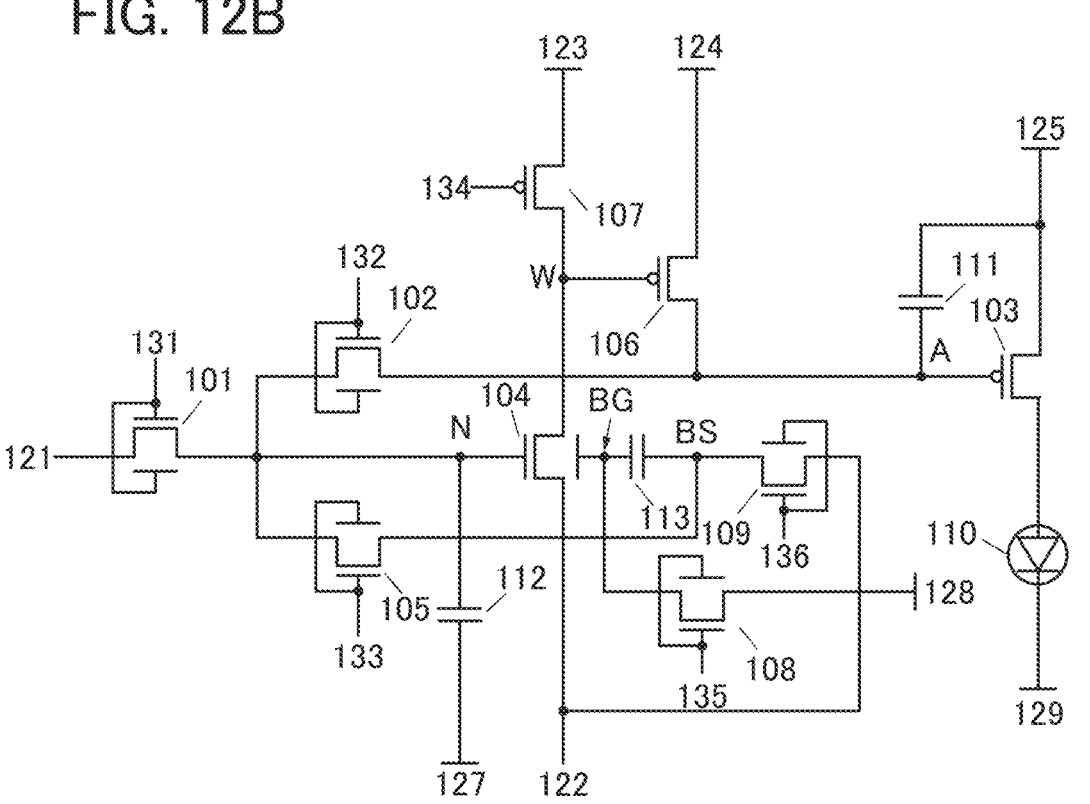

In the case where an OS transistor is used as an n-channel transistor in the structures of the pixels 10*a*, 10*b*, and 10*c*, the transistors 101, 102, 105, 108, and 109 may have back gates as illustrated in FIG. 12B. Supplying the same potential to the back gate and a front gate can increase on-state current. Alternatively, a structure may be employed in which the back gates can be supplied with a constant potential. Supplying a constant potential to the back gate can control the threshold voltage.

In order to improve the display quality of the display device, $V_{th}$ correction of the transistor 103 that is the driving transistor of the light-emitting device 110 may be performed.

Figure 13A:
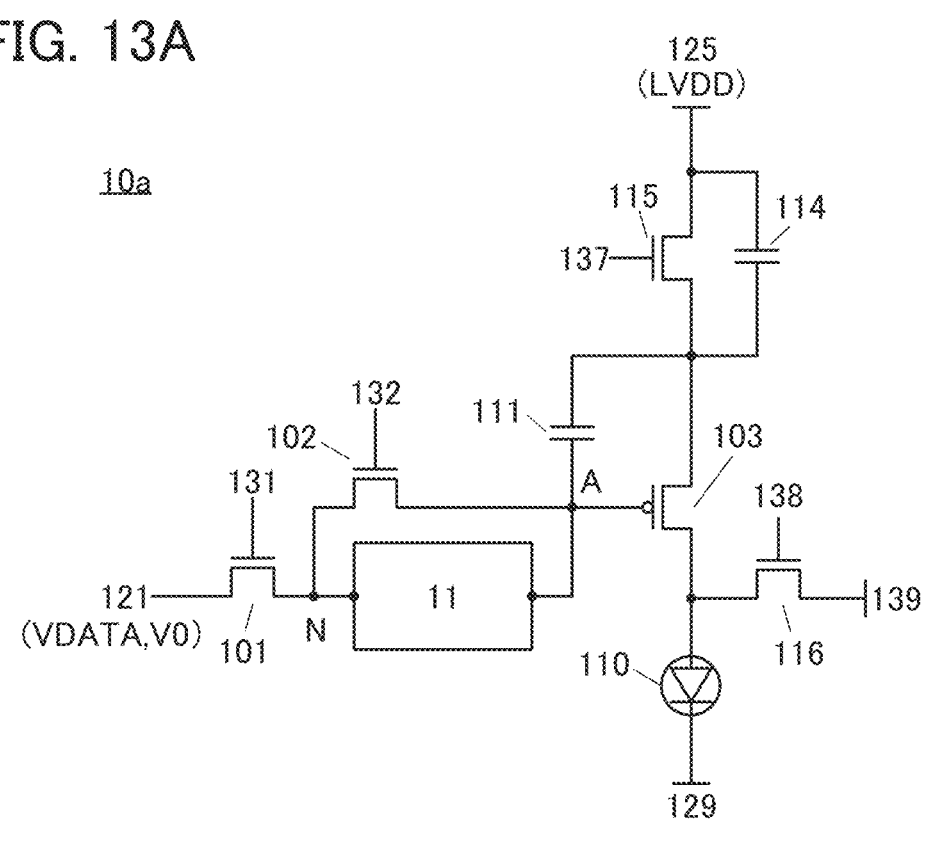
FIG. 13A is a diagram illustrating a pixel circuit.

For example, as illustrated in FIG. 13A, internal correction of $V_{th}$ of the transistor 103 can be performed by adding a transistor 115, a transistor 116, and a capacitor 114 to the structure illustrated in FIG. 1.

One of a source and a drain of the transistor 115 is electrically connected to the other of the source and the drain of the transistor 103 and one electrode of the capacitor 114. The other of the source and the drain of the transistor 115 is electrically connected to the other electrode of the capacitor 114 and the wiring 125. A gate of the transistor 115 is electrically connected to a wiring 137.

One of a source and a drain of the transistor 116 is electrically connected to the one of the source and the drain of the transistor 103. The other of the source and the drain of the transistor 116 is electrically connected to a wiring 139. A gate of the transistor 116 is electrically connected to a wiring 138.

The wirings 137 and 138 each function as a gate line for controlling conduction of the transistor. The wiring 139 is a discharge path and can be a low potential line. Note that a high power supply potential supplied to the wiring 125 is set to LVDD. The data potential VDATA and a potential V0 are alternately supplied to the wiring 121 in a certain period. The potential V0 is a potential at which the transistor 103 is turned on when a source potential of the transistor 103 is LVDD and a gate potential is V0, and can be a low potential such as 0 V, for example.

The transistor 115 functions as a switch for temporarily fixing the source potential of the transistor 103. The transistor 116 has a function of a switch for connecting the transistor 103 and the wiring 139 serving as the discharge path when $V_{th}$ is obtained. Although FIG. 13A illustrates an example in which n-channel transistors are used as the transistors 115 and 116, p-channel transistors can also be used. The capacitor 114 is a storage capacitor of the source potential of the transistor 103 and has a sufficiently large capacitance than the capacitor 111.

Figure 13B:
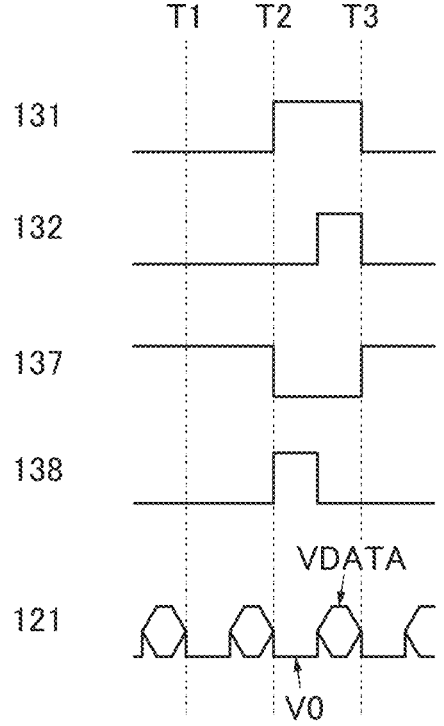
FIG. 13B is a timing chart illustrating the operation of a pixel.
Figure 14A:
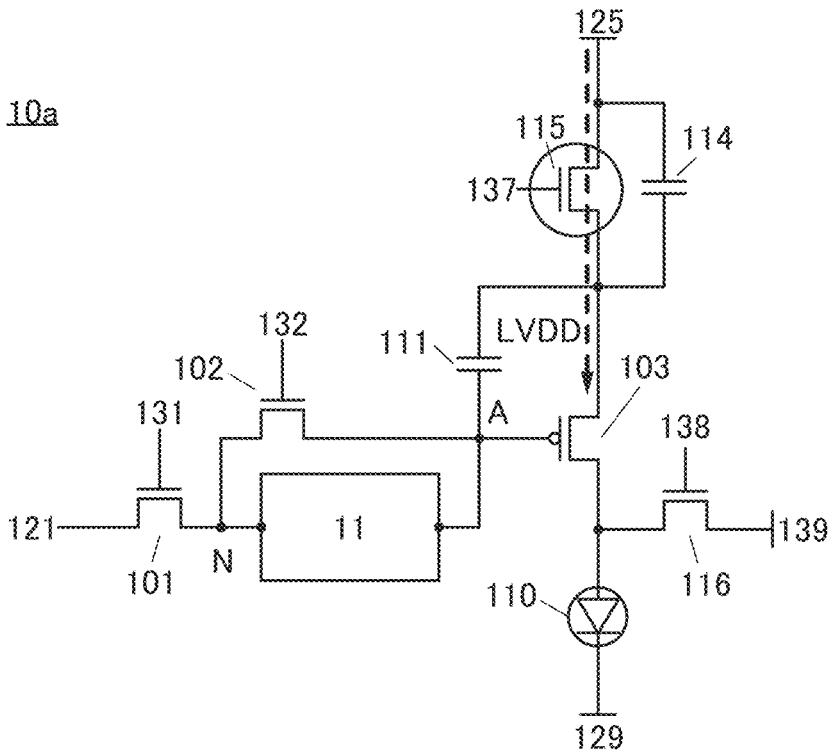
FIG. 14A and FIG. 14B are diagrams each illustrating the operation of a pixel.
Figure 14B:
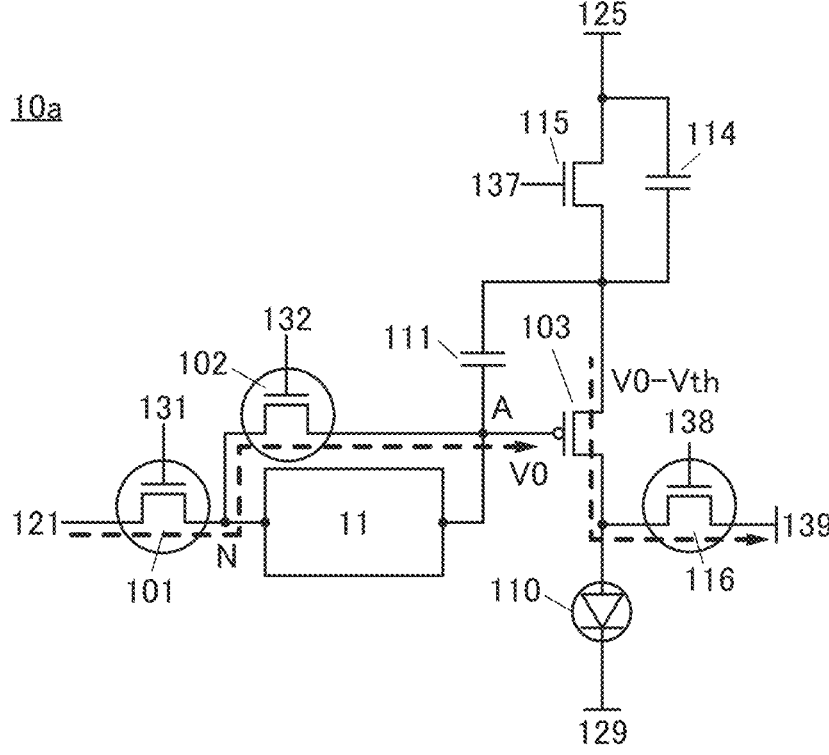

$V_{th}$ correction operation of the transistor 103 is described with reference to a timing chart illustrated in FIG. 13B and diagrams illustrating a circuit operation in FIG. 14A to FIG. 15B. Note that the description of the operation relating to the lighting of the light-emitting device 110 is similar to the above description and thus is omitted.

First, a high potential ("H") is supplied to the wiring 137 at Time T1, whereby the transistor 115 is turned on. At this time, the source potential of the transistor 103 becomes LVDD (see FIG. 14A).

The potential V0 is supplied to the wiring 121 at the beginning of Time T2. At this timing, a high potential ("H") is supplied to the wirings 131 and 138. A low potential ("L") is supplied to the wiring 137. At this time, the transistors 101 and 102 are turned on and the potential V0 is supplied to the gate of the transistor 103. Furthermore, while the transistor 115 is turned off, the transistor 116 is turned on and the transistor 103 is turned on and then the source potential starts to decrease. Then, when the source potential is discharged from LVDD to $V0-V_{th}$, the transistor 103 is turned off (see FIG. 14B).

The potential supplied to the wiring 121 is switched from V0 to VDATA between Time T2 and Time T3. At this timing, a high potential ("H") is supplied to the wiring 132. A low potential ("L") is supplied to the wiring 138 to turn off the transistor 116. At this time, the data potential VDATA is supplied to the gate of the transistor 103.

Figure 15A:
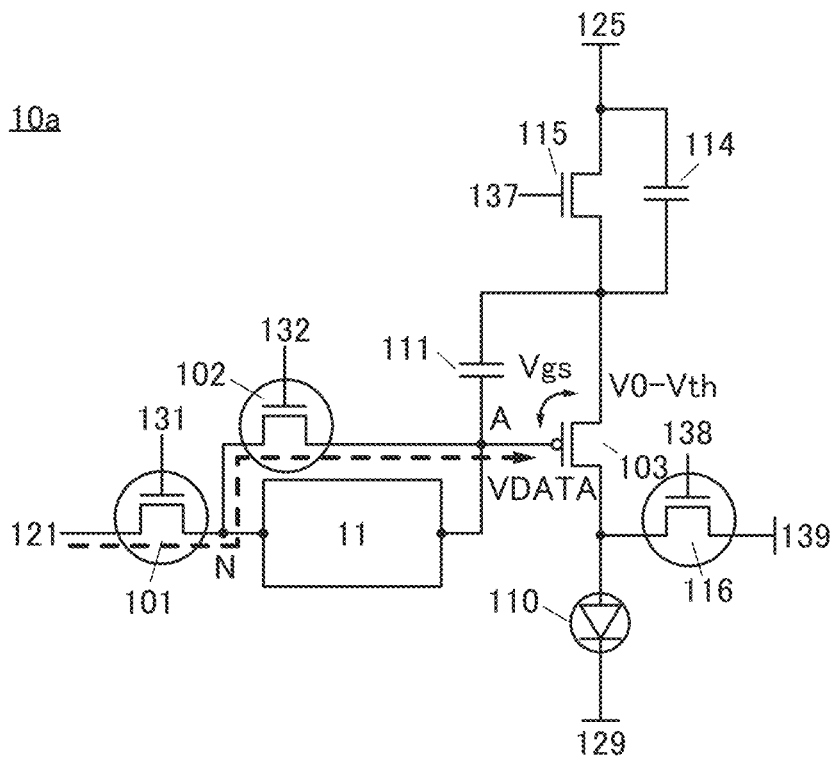
FIG. 15A and FIG. 15B are diagrams each illustrating the operation of a pixel.
Figure 15B:
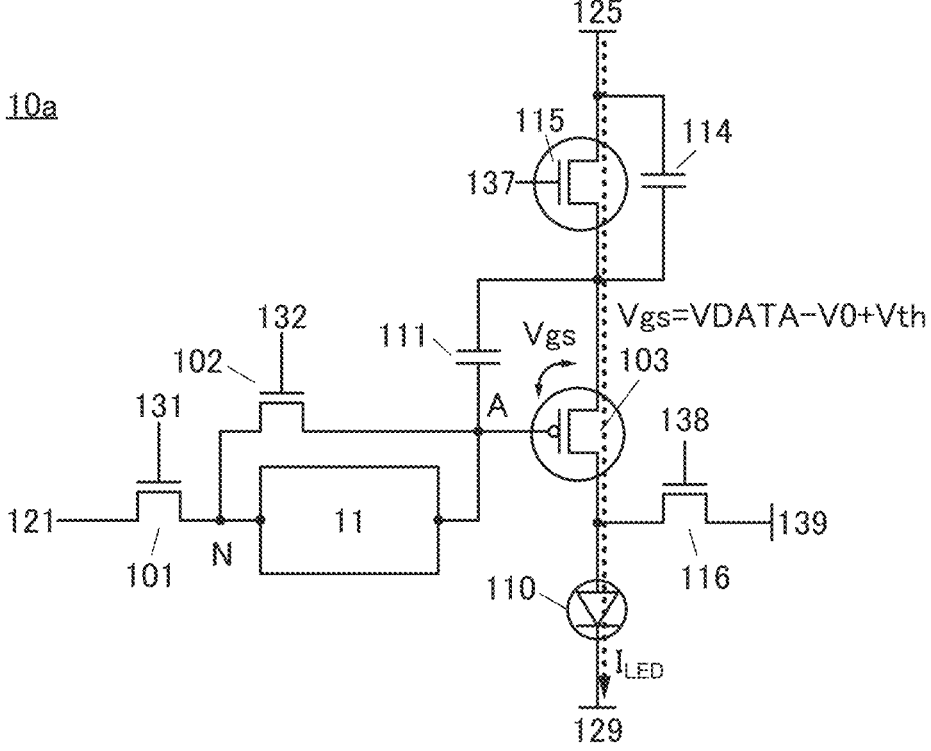

Here, the capacitor 114 has sufficiently large capacitance than the capacitor 111: thus, the source potential of the transistor 103 is substantially kept at $V0-V_{th}$ (see FIG. 15A). Thus, $V_{gs}$ of the transistor 103 at this time becomes $VDATA-V0+V_{th}$.

At Time T3, the high potential ("H") is supplied to the wiring 137, and a low potential ("L") is supplied to the wiring 131 and the wiring 132. At this time, the transistors 101 and 102 are turned off, and the source potential of the transistor 103 becomes LVDD. Then, the transistor 103 is turned on in accordance with $V_{gs}=VDATA-V0+V_{th}$ that is kept by the capacitor 111, whereby current $I_{LED}$ flows through the light-emitting device 110 (see FIG. 15B).

The $I_{LED}$ follows the formula of drain current flowing through the transistor 103, $I_d=\beta/2\ (V_{gs}-V_{th})^2$. Here, $\beta$ is a coefficient. When $V_{gs}=VDATA-V0+V_{th}$ is substituted into the formula, the term including $V_{th}$ is canceled; therefore, it can be said that the drain current is independent of Vth. That is, the $I_{LED}$ is independent of the variation in $V_{th}$ of the transistor 103, so that the display quality of the display device can be improved.

Next, an effect of switching between PAM control and PAM+PWM control, which can be performed in one embodiment of the present invention, will be described.

Figure 16A:
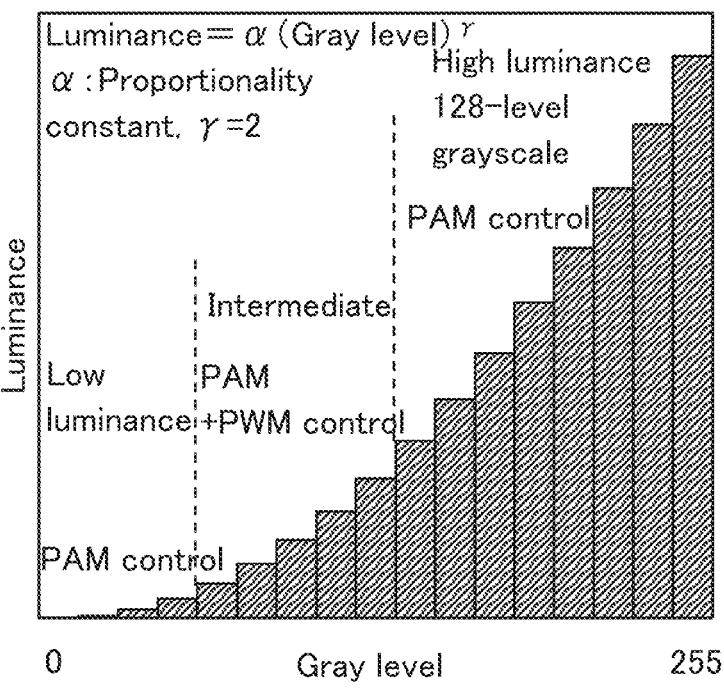
FIG. 16A is a diagram showing a relation between a gray level and luminance.

FIG. 16A is a diagram illustrating a relation between a gray level (an input value: 8 bit) and luminance (an output value) in accordance with a γ-curve (γ value=2). In the pixel 10a to the pixel 10c of one embodiment of the present invention, the input/output shown in FIG. 16A can be performed, and the operation method can be switched in a desired range of the gray level.

For example, the operation can be performed by PAM control in the low luminance 32-level grayscale (luminance corresponding to 0 to 31-level grayscale) and the high luminance 128-level grayscale (luminance corresponding to 128 to 255-level grayscale), and the operation can be performed by PAM+PWM control in the intermediate 96-level grayscale (luminance corresponding to 32 to 127-level grayscale). The operation enables the display of an image with reduced chromaticity variation. Note that the operation method and the timing of the switching are not limited thereto and can be set as desired. The operation may also be performed using either PAM control or PWM control throughout the entire range.

Figure 16B:
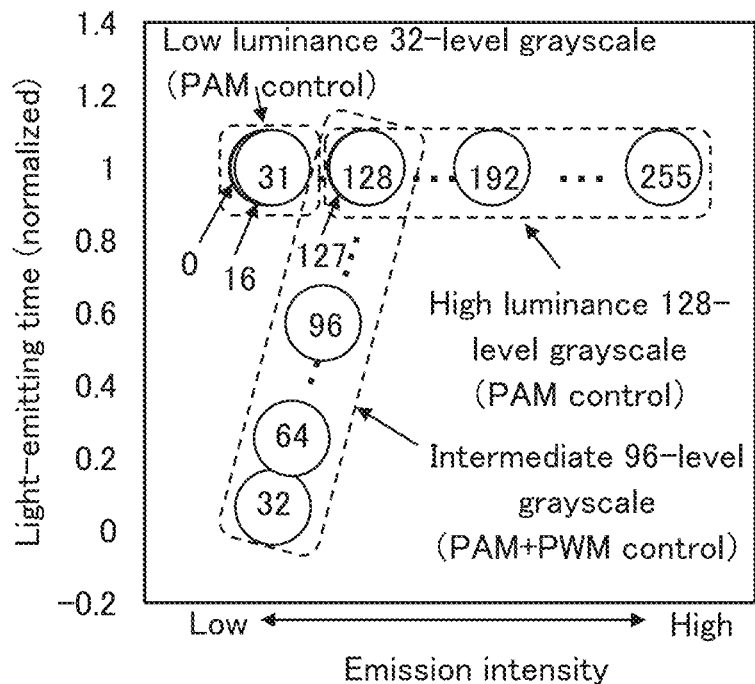
FIG. 16B is a diagram illustrating the operation corresponding to luminance using an emission intensity and an emission time of a light-emitting device.

FIG. 16B is a diagram describing the above operation using the emission intensity and the light-emitting time of the light-emitting device. The values shown inside markers or indicated by arrows represent input values of the gray level.

In the low luminance 32-level grayscale and the high luminance 128-level grayscale, PAM control operation is performed with the relatively long light-emitting time and makes the light-emitting device emit light. In PAM control, the emission intensity of the light-emitting device can be controlled by controlling the amplitude, and thus the control in the low-luminance, which is difficult by PWM control, can also be accurately performed.

In the intermediate 96-level grayscale, PAM+PWM control operation is performed by changing both the emission intensity and the width of the pulse signal in the range of medium degree to make the light-emitting device emit light. In the intermediate 96-level grayscale, a very short light emitting period (a pulse signal having a very short width) is not necessarily used; thus, the control is performed without any problems even by PWM control. The control in the intermediate 96-level grayscale, which changes both the emission intensity and the light-emitting time, can be regarded as PAM+PWM control.

Figure 17A:
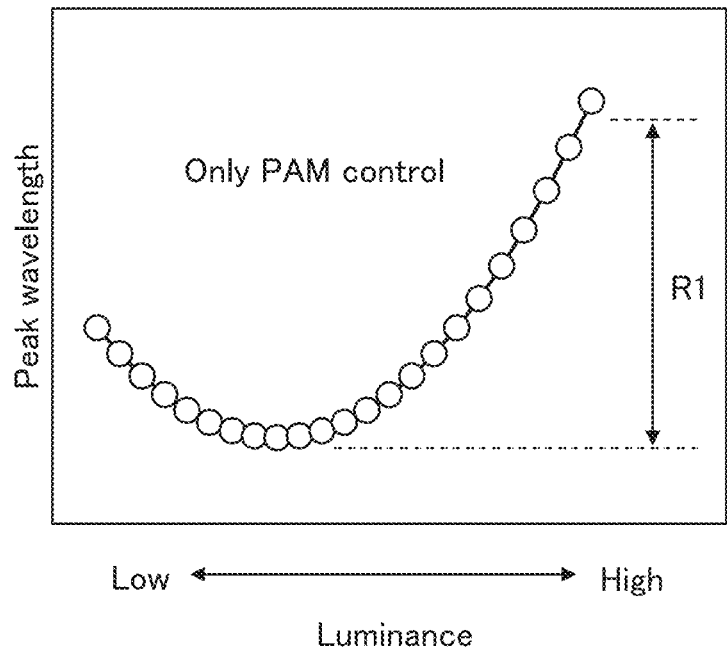
FIG. 17A and FIG. 17B are diagrams each illustrating a range of chromaticity variation.

FIG. 17A is a diagram describing an example of a change in the peak wavelength when the luminance of the light-emitting device is changed in PAM control. The difference between the minimum value and the maximum value in such characteristics is the range of chromaticity variation (R1). When the light-emitting operation is performed by PAM control from low luminance to high luminance, the chromaticity variation increases and the display quality decreases in some cases.

Figure 17B:
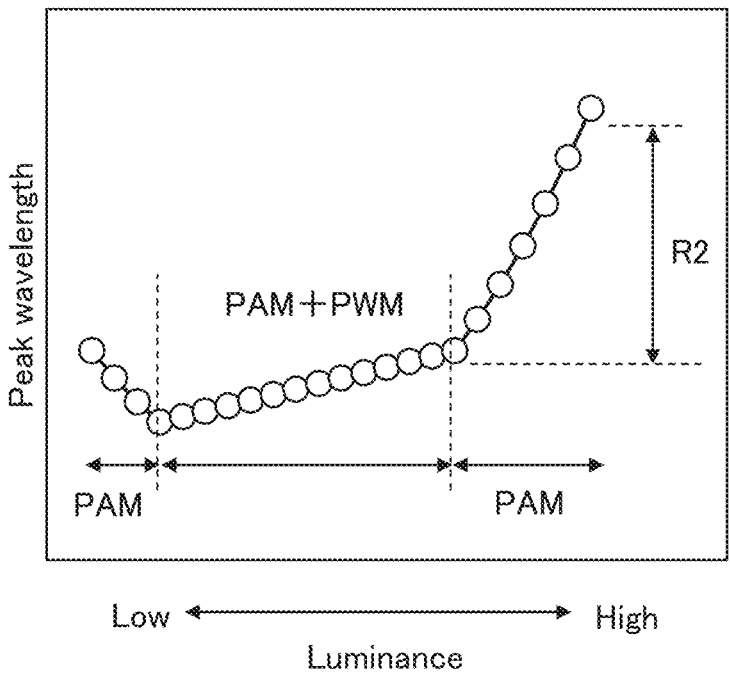

FIG. 17B is a diagram illustrating an example of a change in the peak wavelength when the operation described with reference to FIG. 16A and FIG. 16B is performed and the luminance of the light-emitting is changed. Since PAM+PWM control is performed in the range in the vicinity of the minimum value in FIG. 17A, variation in the peak wavelength in the range can be small. Accordingly, the range of chromaticity variation (R2) can be smaller than R1. That is, the operation described above as an example performed with the use of the display device of one embodiment of the present invention can mitigate a reduction in display quality.

Figure 18:
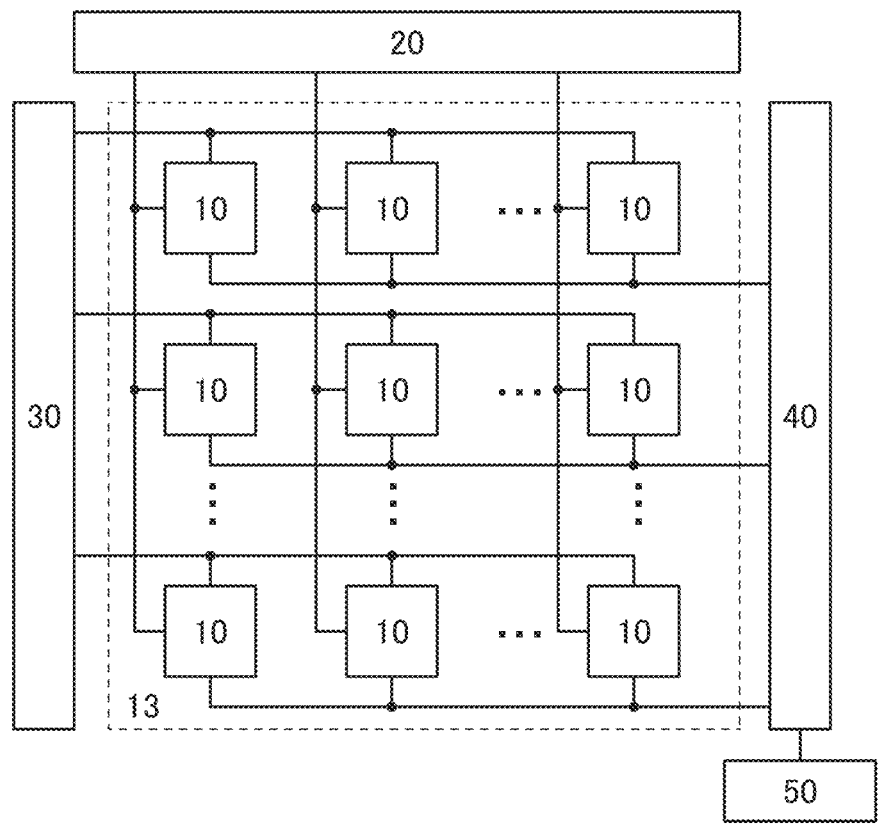
FIG. 18 is a block diagram illustrating a display device.

FIG. 18 is a block diagram illustrating the display device of one embodiment of the present invention. The display device includes a pixel array 13, a source driver 20, and a gate driver 30. The pixel array 13 includes pixels 10 arranged in a column direction and a row direction. The pixels 10a to 10c described in this embodiment can be used as each of the pixels 10. Note that wirings are illustrated in a simplified way in the drawing, and the wirings connected to the components of the pixel 10 of one embodiment of the present invention are provided.

A slope potential supply circuit 40 is provided and electrically connected to the pixel 10. The slope potential supply circuit 40 is electrically connected to a slope potential generation circuit 50.

A sequential circuit such as a shift register can be used for the source driver 20, the gate driver 30, and the slope potential supply circuit 40. The source driver 20 can supply the data potential VDATA to the pixel 10.

The source driver 20, the gate driver 30, and the slope potential supply circuit 40 can be formed in the layer 310 illustrated in FIG. 3A and FIG. 3B. Alternatively, the source driver 20, the gate driver 30, and the slope potential supply circuit 40 can be provided over an IC chip which is attached by a COF (chip on film) method, a COG (chip on glass) method, a TCP (tape carrier package) method, or the like.

Although an example in which the gate driver 30 is placed on one side of the pixel array 13 is illustrated, two gate drivers 30 may be placed to face each other with the pixel array 13 therebetween to divide driving rows.

This embodiment can be implemented in an appropriate combination with the structures described in the other embodiments.

Embodiment 2

In this embodiment, the stacked-layer structure of the display device of one embodiment of the present invention illustrated in FIG. 3A and FIG. 3B is described.

Figures 19A, 19B:
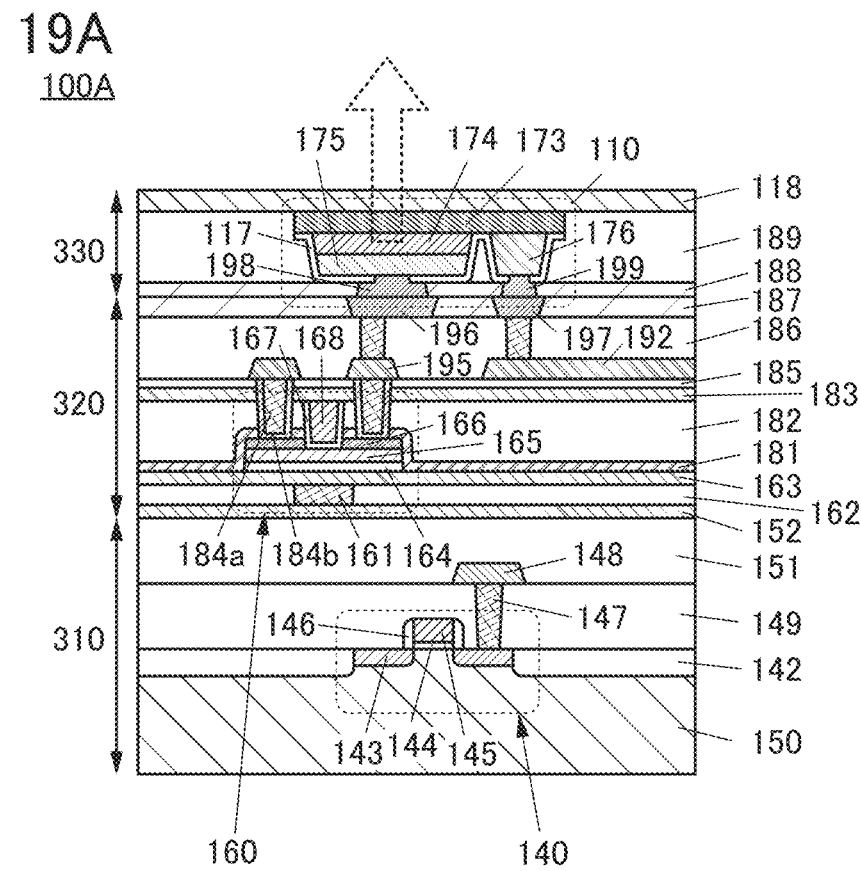
FIG. 19A and FIG. 19B are diagrams illustrating display devices.

FIG. 19A is a cross-sectional view of a display device 100A of one embodiment of the present invention. The display device 100A has a structure in which the layer 310 provided with a transistor included in a driver circuit or the like in a pixel circuit, the layer 320 provided with a transistor, a wiring, and the like included in the pixel circuit, and the layer 330 provided with a light-emitting device such as an LED included in the pixel circuit are stacked in this order.

Although the display device is divided into a plurality of layers for convenience of the description in this embodiment, the boundaries between the layers are not strictly defined. For example, in the case where a component described as a component of the layer 310 is positioned in the vicinity of the boundary between the layer 310 and the layer 320, the component can also be regarded as a component of the layer 320. Furthermore, the component may be positioned in a layer other than the layer 310 unless the function of the component is hindered. Moreover, in one embodiment of the present invention, if needed, an insulating layer and a conductive layer may be provided in addition to insulating layers and conductive layers included in the respective layers. Alternatively, some of the insulating layers and the conductive layers included in the respective layers may be omitted if needed.

For example, the layer 310 includes a transistor 140 that is a component of the driver circuit (one or both of a gate driver and a source driver) of the pixel circuit, a memory circuit, an arithmetic circuit, and the like. The transistor 140 needs to operate at high speed, and thus a transistor including silicon (single crystal silicon, polycrystalline silicon, amorphous silicon, or the like) in a channel formation region (hereinafter, Si transistor) is preferably used. FIG. 19A illustrates an example in which single crystal silicon is used for a substrate 150, and the transistor 140 includes a channel formation region in the substrate 150.

Note that part of the driver circuit of the pixel circuit may be provided in an external IC chip connected to the pixel circuit.

The transistor 140 includes a conductive layer 145, an insulating layer 144, an insulating layer 146, and a pair of low-resistance regions 143. The conductive layer 145 functions as a gate. The insulating layer 144 is positioned between the conductive layer 145 and the substrate 150 and functions as a gate insulating layer. The insulating layer 146 is provided to cover a side surface of the conductive layer 145 and functions as a sidewall. The pair of low-resistance regions 143 are regions doped with an impurity in the substrate 150; one of them functions as a source of the transistor and the other functions as a drain of the transistor. Furthermore, an element isolation layer 142 is provided around the transistor.

An insulating layer 149 is provided to cover the transistor 140, and a conductive layer 148 is provided over the insulating layer 149. A conductive layer 147 is embedded in an opening portion provided in the insulating layer 149. The conductive layer 148 is electrically connected to one of the pair of low-resistance regions 143 through the conductive layer 147. An insulating layer 151 is provided to cover the conductive layer 148. The conductive layer 148 functions as a wiring. The wiring can electrically connect any of another transistor of the circuit including the transistor 140 as a component, the pixel circuit, another circuit, and the like to each other.

The layer 320 includes a transistor 160 that is a component of the pixel circuit, an insulating layer 152, an insulating layer 162, an insulating layer 163, an insulating layer 181, an insulating layer 182, an insulating layer 183, a conductive layer 184a, a conductive layer 184b, an insulating layer 185, an insulating layer 186, an insulating layer 187, a conductive layer 192, a conductive layer 195, a conductive layer 196, and a conductive layer 197. One or more of these components are sometimes considered as components of a transistor, but are not regarded as components of a transistor in the description in this embodiment. Note that each of the conductive layers and the insulating layers included in the layer 320 is not limited to a single-layer structure and may be a stacked-layer structure.

The insulating layer 152 is provided over the layer 310. The insulating layer 152 functions as a barrier layer that inhibits diffusion of impurities such as water and hydrogen from the layer 310 into the transistor 160 and release of oxygen from a metal oxide layer 165 of the transistor 160 to the layer 310 side. As the insulating layer 152, for example, a film through which hydrogen and oxygen are less likely to diffuse than through a silicon oxide film, such as an aluminum oxide film, a hafnium oxide film, or a silicon nitride film, can be used.

The transistor 160 includes a conductive layer 161, the insulating layer 163, an insulating layer 164, the metal oxide layer 165, a pair of conductive layers 166, an insulating layer 167, a conductive layer 168, and the like.

The transistor 160 is preferably a transistor including the metal oxide layer 165 in a channel formation region (OS transistor). The metal oxide layer 165 includes a first region overlapping with one of the pair of conductive layers 166, a second region overlapping with the other of the pair of conductive layers 166, and a third region between the first region and the second region.

An OS transistor does not require a bonding step or the like and can be formed in a region overlapping with a Si transistor with an insulating layer and the like therebetween.

Accordingly, a stacked-type device can be manufactured in a simple process and manufacturing cost can be reduced.

An OS transistor has characteristics of capability of high speed operation owing to high mobility, high reliability, and the like as compared with a transistor using amorphous silicon. A metal oxide used for an OS transistor can be formed in a film formation step, so that a laser apparatus and the like required for the crystallization step of polycrystalline silicon can be omitted. Accordingly, a highly reliable display device can be manufactured at a low cost with an OS transistor.

The conductive layer 161 and the insulating layer 162 are provided over the insulating layer 152, and the insulating layer 163 is provided to cover the conductive layer 161 and the insulating layer 162. The insulating layer 164 is provided over the insulating layer 163, and the metal oxide layer 165 is provided over the insulating layer 164.

The conductive layer 161 functions as a gate electrode, and the insulating layer 163 and the insulating layer 164 function as gate insulating layers. The conductive layer 161 includes a region overlapping with the metal oxide layer 165 with the insulating layer 163 and the insulating layer 164 therebetween. Like the insulating layer 152, the insulating layer 163 is preferably formed using a material that functions as a barrier layer. As the insulating layer 164 in contact with the metal oxide layer 165, an oxide insulating film such as a silicon oxide film is preferably used.

The pair of conductive layers 166 are provided over the metal oxide layer 165 to be apart from each other. One of the pair of conductive layers 166 functions as a source of the transistor and the other functions as a drain. The insulating layer 181 is provided to cover the metal oxide layer 165 and the pair of conductive layers 166, and the insulating layer 182 is provided over the insulating layer 181.

An opening portion reaching the metal oxide layer 165 is provided in the insulating layer 181 and the insulating layer 182, and the insulating layer 167 and the conductive layer 168 are embedded in the opening portion. The opening portion is provided in a position overlapping with the third region of the metal oxide layer 165. The insulating layer 167 includes a region overlapping with a side surface of the insulating layer 181 and a side surface of the insulating layer 182. The conductive layer 168 includes a region overlapping with the side surface of the insulating layer 181 and the side surface of the insulating layer 182 with the insulating layer 167 therebetween.

The conductive layer 168 functions as a gate electrode, and the insulating layer 167 functions as a gate insulating layer. The conductive layer 168 includes a region overlapping with the metal oxide layer 165 with the insulating layer 167 therebetween.

The insulating layer 183 and the insulating layer 185 are provided to cover the top surfaces of the insulating layer 182, the insulating layer 167, and the conductive layer 168.

Like the insulating layer 152, the insulating layer 181 and the insulating layer 183 are each preferably formed using a material that functions as a barrier layer. When the pair of conductive layers 166 is covered with the insulating layer 181, oxidation of the pair of conductive layers 166 due to oxygen contained in the insulating layer 182 can be inhibited.

A plug electrically connected to one of the pair of conductive layers 166 and the conductive layer 195 is embedded in an opening portion provided in the insulating layer 181, the insulating layer 182, the insulating layer 183, and the insulating layer 185. The plug can include the conductive layer 184b in contact with the side surface of the opening portion and the top surface of one of the pair of conductive layers 166, and the conductive layer 184a embedded inside the conductive layer 184b. The conductive layer 184b is preferably formed using a conductive material through which hydrogen and oxygen are less likely to diffuse.

The conductive layer 192, the conductive layer 195, and the insulating layer 186 are provided over the insulating layer 185. The conductive layer 196, the conductive layer 197, and the insulating layer 187 are provided over the insulating layer 186. The conductive layer 195 is electrically connected to the conductive layer 196 through a plug. The conductive layer 192 is electrically connected to the conductive layer 197 through a plug.

Here, the insulating layer 186 can have a planarization function. The insulating layer 187, the conductive layer 196, and the conductive layer 197 function as bonding layers. The conductive layer 196 and the conductive layer 197 each include a region embedded in the insulating layer 187, and surfaces of the conductive layer 196, the conductive layer 197, and the insulating layer 187 are planarized to be level with each other.

The layer 330 includes the light-emitting device 110 provided over a support layer 118. A side surface of the light-emitting device 110 is sealed with an insulating layer 189, and an insulating layer 188, a conductive layer 198, and a conductive layer 199 are provided over the top surface of the light-emitting device 110. The conductive layer 198 is electrically connected to the one electrode of the light-emitting device 110, and the conductive layer 199 is electrically connected to the other electrode of the light-emitting device 110. As the insulating layer 189, an insulating resin layer or the like is preferably used.

Here, the insulating layer 188, the conductive layer 198, and the conductive layer 199 function as bonding layers. The conductive layer 198 and the conductive layer 199 each include a region embedded in the insulating layer 188, and surfaces of the conductive layer 198, the conductive layer 199, and the insulating layer 188 are planarized to be level with each other.

The surface of the layer 330 (the insulating layer 188, the conductive layer 198, and the conductive layer 199) is bonded to the surface of the layer 320 (the insulating layer 187, the conductive layer 196, and the conductive layer 197). Here, the insulating layer 188 is bonded and connected to the insulating layer 187. The conductive layer 198 and the conductive layer 196 are bonded, connected, and electrically connected to each other. The conductive layer 199 and the conductive layer 197 are bonded, connected, and electrically connected to each other.

The insulating layer 188 and the insulating layer 187 are preferably formed of the same component. Furthermore, the conductive layer 198 and the conductive layer 196 are preferably composed of metals whose main components are the same. Furthermore, the conductive layer 199 and the conductive layer 197 are preferably composed of metals whose main components are the same.

For example, the insulating layers 187 and 188 are preferably formed using a single layer or a stack including one or more of inorganic insulating materials such as silicon oxide, silicon oxynitride, silicon nitride oxide, silicon nitride, aluminum oxide, hafnium oxide, and titanium nitride.

Copper, aluminum, tin, zinc, tungsten, silver, platinum, gold, or the like can be used for the conductive layers 196 to 199. Copper, aluminum, tungsten, or gold is preferably used in terms of ease of bonding.

The transistor 160 can be used as a transistor included in the pixel circuit. The transistor 140 can be used as a transistor included in the driver circuit (e.g., one or both of a gate driver and a source driver) for driving the pixel circuit. Note that the transistor 140 may be a transistor included in the pixel circuit. Moreover, the transistors 140 and 160 can also be used as transistors included in a variety of circuits such as an arithmetic circuit, a memory circuit, and the like.

With such a structure, not only the components such as the transistor included in the pixel circuit but also the components such as the transistor included in the driver circuit can be formed directly under the light-emitting device; thus, the display device can be downsized as compared with the case where the driver circuit is provided outside a display portion. In addition, the display device can have a narrow bezel (narrow non-display region).

The light-emitting device 110 includes a semiconductor layer 173, a light-emitting layer 174, and a semiconductor layer 175, which are provided in this order over the support layer 118. A conductive layer 176 is provided over the semiconductor layer 173. The stack of the light-emitting layer 174 and the semiconductor layer 175 and the conductive layer 176 are covered with an insulating layer 117. The semiconductor layer 175 is electrically connected to the conductive layer 198 through a first opening portion provided in the insulating layer 117. The conductive layer 176 is electrically connected to the conductive layer 199 through a second opening portion provided in the insulating layer 117.

Gallium nitride or the like formed over a sapphire substrate by epitaxial growth method is used as the support layer 118, for example, and the semiconductor layer 173, the light-emitting layer 174, the semiconductor layer 175, the insulating layer 117, and the conductive layer 176 formed over the support layer 118 are processed to form a plurality of light-emitting devices 110. The plurality of light-emitting devices formed through the steps can be referred to as a light-emitting device formed with a monolithic structure.

Then, the insulating layer 189 and the bonding layer are formed over the light-emitting device 110, and the plurality of light-emitting devices 110 are bonded to the layer 320 in the same step. After that, a step of separating the sapphire substrate is performed and the structure illustrated as the display device 100A is formed.

The light-emitting layer 174 is positioned between the semiconductor layer 173 and the semiconductor layer 175. In the light-emitting layer 174, electrons and holes are combined to emit light. An n-type semiconductor layer can be used as one of the semiconductor layer 173 and the semiconductor layer 175, and a p-type semiconductor layer can be used as the other. An n-type semiconductor layer, an i-type semiconductor layer, or a p-type semiconductor layer can be used as the light-emitting layer 174.

A stacked-layer structure including the semiconductor layer 173, the light-emitting layer 174, and the semiconductor layer 175 is formed so as to emit red light, green light, blue light, bluish violet light, violet light, ultraviolet light, or the like. For the stacked-layer structure, for example, a compound containing a Group 13 element and a Group 15 element (also referred to as a Group III-V compound) can be used. Examples of the Group 13 element include aluminum, gallium, and indium. Examples of the Group 15 element include nitrogen, phosphorus, arsenic, and antimony.

For example, a pn junction or a pin junction is formed using a compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like to manufacture a light-emitting device emitting target light. Note that a compound other than the above may be also used.

The pn junction or the pin junction of the light-emitting device 110 may be not only a homojunction but also a heterojunction or a double heterojunction. Alternatively, a light-emitting device having a quantum well junction, a light-emitting device using a nanocolumn, or the like may be used.

A material such as gallium nitride can be used for a light-emitting device emitting light in the ultraviolet wavelength range to the blue wavelength range, for example. A material such as a compound of indium and gallium nitride can be used for a light-emitting device emitting light in the ultraviolet wavelength range to the green wavelength range. A material such as a compound of aluminum, gallium, indium, and phosphorus or a compound of gallium and arsenic can be used for a light-emitting device emitting light in the green wavelength range to the red wavelength range. A material such as a compound of gallium and arsenic can be used for a light-emitting device emitting light in the infrared wavelength range.

When the plurality of light-emitting devices 110 provided on the same plane emit light of different colors such as R (red), G (green), and B (blue), for example, a color image can be displayed.

Alternatively, all light-emitting devices 110 provided on the same plane may emit light of the same color. In this case, light emitted from the light-emitting layer 174 is extracted to the outside of the display device through one or both of a color conversion layer and a coloring layer. Such a structure will be described in detail in Embodiment 3.

The display device of this embodiment may include a light-emitting device emitting infrared light. The light-emitting device emitting infrared light can be used as a light source of an infrared light sensor, for example.

Although FIG. 19A illustrates the structure in which the layer 330 is bonded to the layer 320, the structure in which the single light-emitting device 110 is mounted using a flip-chip bonding or the like and sealed with the insulating layer 189 as in a display device 100B illustrated in FIG. 19B may be employed.

This embodiment can be implemented in an appropriate combination with the structures described in the other embodiments.

Embodiment 3

In this embodiment, a structure is described in which a color conversion layer is provided on the light-emission side of the light emitting device in the display device described in Embodiment 2. Note that detailed description of the same components as Embodiment 2 is omitted.

Figure 20:
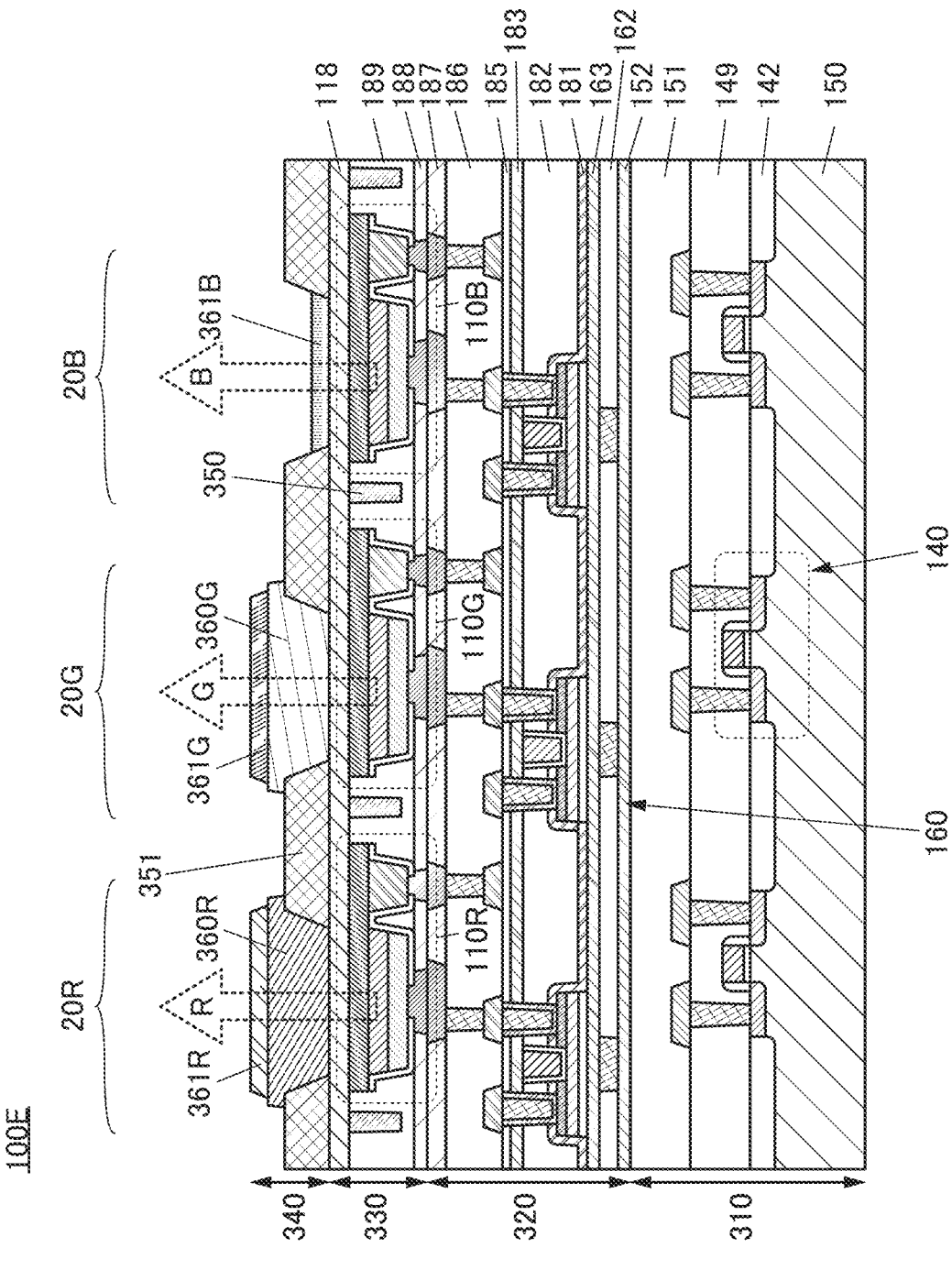
FIG. 20 is a diagram illustrating a display device.

FIG. 20 is a cross-sectional view of a display device 100E. The display device 100E includes a pixel 20R emitting red light, a pixel 20G emitting green light, and a pixel 20B emitting blue light. A layer 340 is provided over the layer 330 provided with the light-emitting device. A color conversion layer, a coloring layer, a light-blocking layer, and the like are provided in the layer 340.

The pixel 20R includes a light-emitting device 110R. The pixel 20G includes a light-emitting device 110G. The pixel 20B includes a light-emitting device 110B. The light-emitting device 110R, the light-emitting device 110G, and the light-emitting device 110B emit light of the same color. That is, the light-emitting device 110R, the light-emitting device 110G, and the light-emitting device 110B can have the same structure.

Specifically, the light-emitting device 110R, the light-emitting device 110G, and the light-emitting device 110B preferably emit blue light. In order to create a color image, pixels emitting light of three primary colors of red (R), green (G), and blue (B) can be used. In the display device described in this embodiment, a color conversion layer is used in a pixel, a color of light emitted from the light-emitting device is changed into a needed color, and the light is emitted to the outside. Here, with a light-emitting device emitting blue light, a color conversion layer is not needed in a pixel emitting blue light, and thus the manufacturing cost can be reduced.

A color conversion layer 360R and a coloring layer 361R are provided in the red pixel 20R in a region overlapping with the light-emitting device 110R. Light emitted from the light-emitting device 110R is converted from blue light to red light by the color conversion layer 360R, the purity of the red light is improved by the coloring layer 361R, and the light is emitted to the outside of the display device 100E. Note that the coloring layer 361R may be omitted.

A color conversion layer 360G and a coloring layer 361G are provided in the green pixel 20G in a region overlapping with the light-emitting device 110G. Light emitted from the light-emitting device 110G is converted from blue light into green light by the color conversion layer 360G, the purity of the green light is improved by the coloring layer 361G, and the light is emitted to the outside of the display device 100E. Note that the coloring layer 361G may be omitted.

A coloring layer 361B is provided in the blue pixel 20B in a region overlapping with the light-emitting device 110B. The purity of blue light emitted from the light-emitting device 110B is improved by the coloring layer 361B, and the light is emitted to the outside of the display device 100E. Note that the coloring layer 361B may be omitted. As described above, a color conversion layer can be omitted in the blue pixel 20B.

In the display device 100E, only one type of light-emitting device needs to be formed over a substrate; hence, a manufacturing apparatus and a manufacturing process can be simplified compared to the case where a plurality of types of light-emitting devices are formed.

A light-blocking layer 350 is provided between the pixels of respective colors. The light-blocking layer 350 is provided in a position in which at least light emitted from the light-emitting device 110 in the lateral direction is blocked. The light-blocking layer 350 may also be provided in a position in which light emitted from the light-emitting device 110 in the oblique direction is blocked, if needed. A light-blocking layer 351 covering the periphery of the pixels is provided over the support layer 118.

With the light-blocking layer 350 and the light-blocking layer 351, light emitted from the light-emitting device can be prevented from entering an adjacent pixel region of another color, and color mixing can be prevented. Consequently, the display quality of the display device can be improved. Note that either the light-blocking layer 350 or the light-blocking layer 351 may be provided.

There is no particular limitation on materials of the light-blocking layer 350 and the light-blocking layer 351: for example, an inorganic material such as a metal material or an organic material such as a resin containing a pigment (e.g., carbon black) or dye can be used. The light-blocking layer 351 may be formed by stacking coloring layers of respective colors. For example, the light-blocking layer 351 can be formed by staking coloring layers of three colors of red, green, and blue.

The light-emitting device 110R, the light-emitting device 110G, and the light-emitting device 110B may each emit light having a wavelength of a higher photon energy than that of blue light. For example, a light-emitting device emitting bluish violet light, violet light, ultraviolet light (UV light), or the like can be used. With the use of light having a high photon energy, color conversion can be performed efficiently by the color conversion layer.

Figure 21:
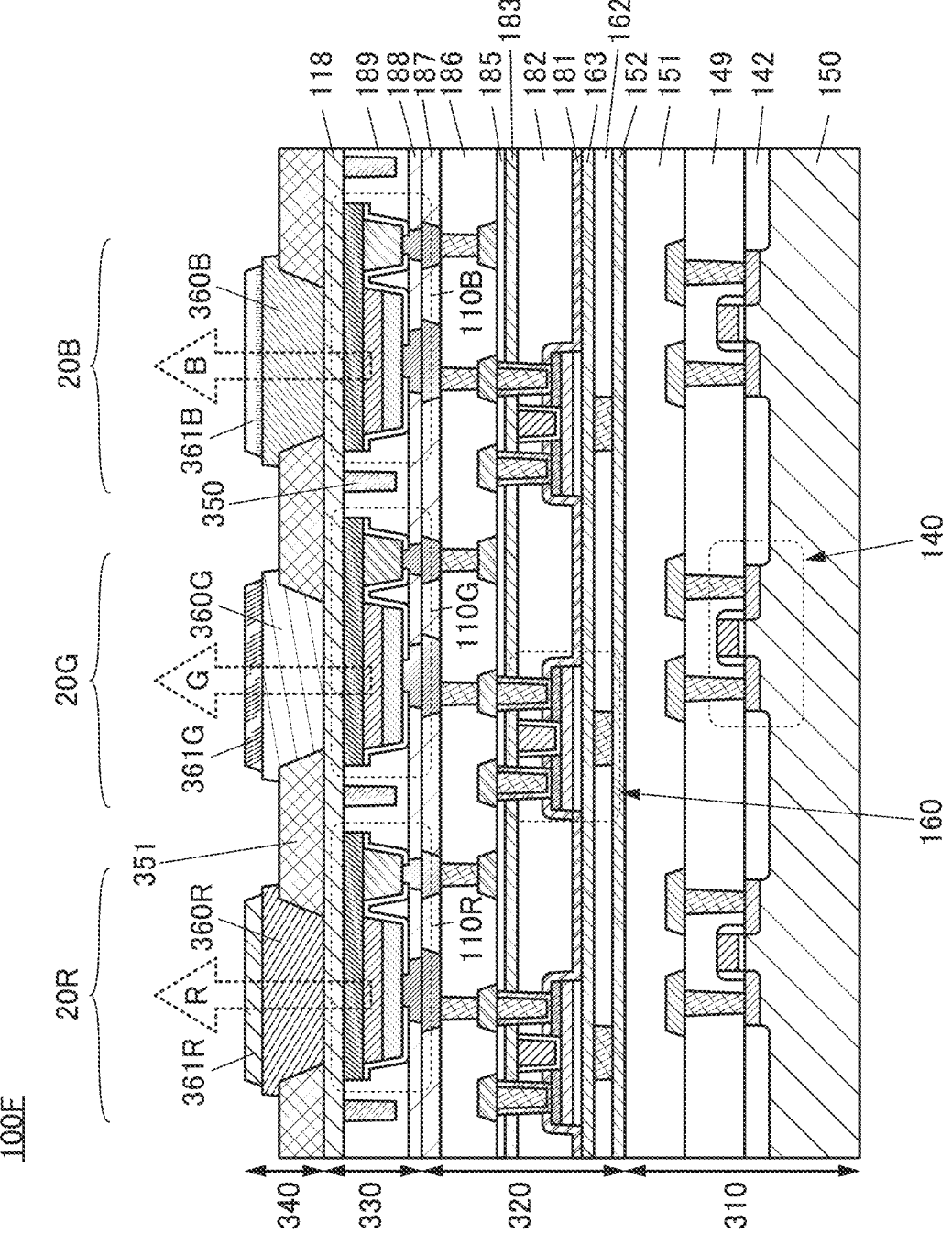
FIG. 21 is a diagram illustrating a display device.

In this case, a color conversion layer 360B and the coloring layer 361B are provided in the blue pixel 20B in a region overlapping with the light-emitting device 110B as in a display device 100F illustrated in FIG. 21. Light emitted from the light-emitting device 110B is converted from bluish violet light, violet light, or ultraviolet light to blue light by the color conversion layer 360B, the purity of the blue light is improved by the coloring layer 361B, and the light is emitted to the outside of the display device 100E. Note that the coloring layer 361B may be omitted.

For the color conversion layer, a phosphor or a quantum dot (QD) is preferably used. In particular, a quantum dot has an emission spectrum with a narrow peak width, whereby emission with high color purity can be obtained. Accordingly, the display quality of the display device can be improved.

The color conversion layer can be formed by a droplet discharge method (e.g., an inkjet method), a coating method, an imprinting method, a variety of printing methods (screen printing or offset printing), or the like. A color conversion film such as a quantum dot film may also be used.

For processing a film to be the color conversion layer, a lithography method can be employed. For example, a method can be employed in which a resist mask is formed over a thin film that is to be processed, the thin film is processed by etching or the like, and then the resist mask is removed. Alternatively, another method may be employed in which after a photosensitive thin film is formed, exposure and development are performed to process the thin film into a desired shape. For example, a thin film is formed using a photosensitive material in which a quantum dot is mixed, and the thin film is processed by a lithography method, whereby an island-shaped color conversion layer can be formed.

There is no particular limitation on a material of a quantum dot, and examples include a Group 14 element, a Group 15 element, a Group 16 element, a compound of a plurality of Group 14 elements, a compound of an element belonging to any of Group 4 to Group 14 elements and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and a variety of semiconductor clusters.

Specific examples include cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide;

antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot whose composition is represented by a given ratio may also be used.

Examples of the quantum dot include a core-type quantum dot, a core-shell quantum dot, and a core-multishell quantum dot. Quantum dots have a high proportion of surface atoms and thus have high reactivity and easily aggregate together. To prevent aggregation of quantum dots and increase dispersiveness to a dispersion medium, it is preferable that a protective agent be attached to, or a protective group be provided on the surfaces of quantum dots. This can also reduce reactivity and improve electrical stability.

Since band gaps of quantum dots are increased as their sizes is decreased, the sizes is adjusted as appropriate so that light with a desired wavelength can be obtained. As the crystal size becomes smaller, light emission from the quantum dots is shifted to a blue color side, i.e., a high energy side; thus, the emission wavelengths of the quantum dots can be adjusted over a wavelength range of a spectrum of an ultraviolet region, a visible light region, and an infrared region by changing the sizes of quantum dots. The size (diameter) of the quantum dot is, for example, greater than or equal to 0.5 nm and less than or equal to 20 nm, preferably greater than or equal to 1 nm and less than or equal to 10 nm. The emission spectrum is narrowed as the size distribution of the quantum dots gets smaller, and thus light with high color purity can be obtained. The shape of the quantum dot is not particularly limited and may be a spherical shape, a rod shape, a circular shape, or other shapes. Quantum rods, which are rod-shaped quantum dots, have a function of emitting directional light.

The coloring layer is a colored layer that transmits light in a specific wavelength range. For example, a color filter that transmits light in a red, green, blue, or yellow wavelength range can be used. Examples of a material that can be used for the coloring layer include a metal material, a resin material, and a resin material containing a pigment or a dye.

Note that although the structure of the display device 100A is used for the basic structure of the display device 100E and the display device 100F as an example, the display device 100B described in Embodiment 2 can also be used.

This embodiment can be implemented in an appropriate combination with the structures described in the other embodiments.

Embodiment 4

In this embodiment, a display device of one embodiment of the present invention will be described with reference to FIG. 22A and FIG. 22B.

The display device of this embodiment can be a high-resolution display device. Accordingly, the display device of this embodiment can be used for display portions of information terminals (wearable devices) such as watch-type and bracelet-type information terminals and display portions of wearable devices capable of being worn on a head, such as a VR (Virtual Reality) device like a head-mounted display (HMD) and a glasses-type AR (Augmented Reality) device.

Figure 22A:
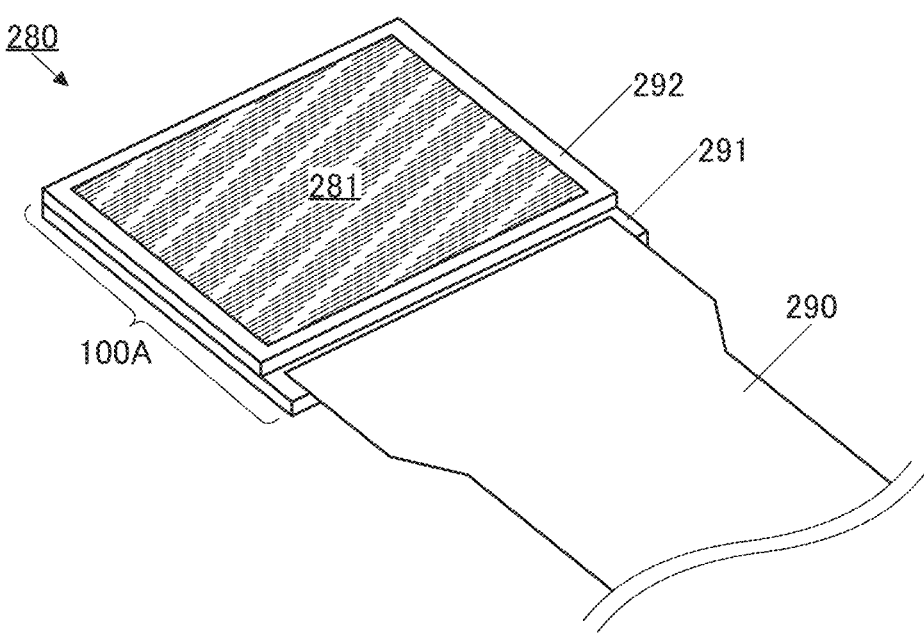
FIG. 22A and FIG. 22B are diagrams illustrating a display device.

FIG. 22A is a perspective view of a display module 280. The display module 280 includes the display device 100A described in the above embodiment and an FPC 290. Note that the display device included in the display module 280 is not limited to the display device 100A and may be any of the display devices 100B, 100E, and 100F.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 22B:
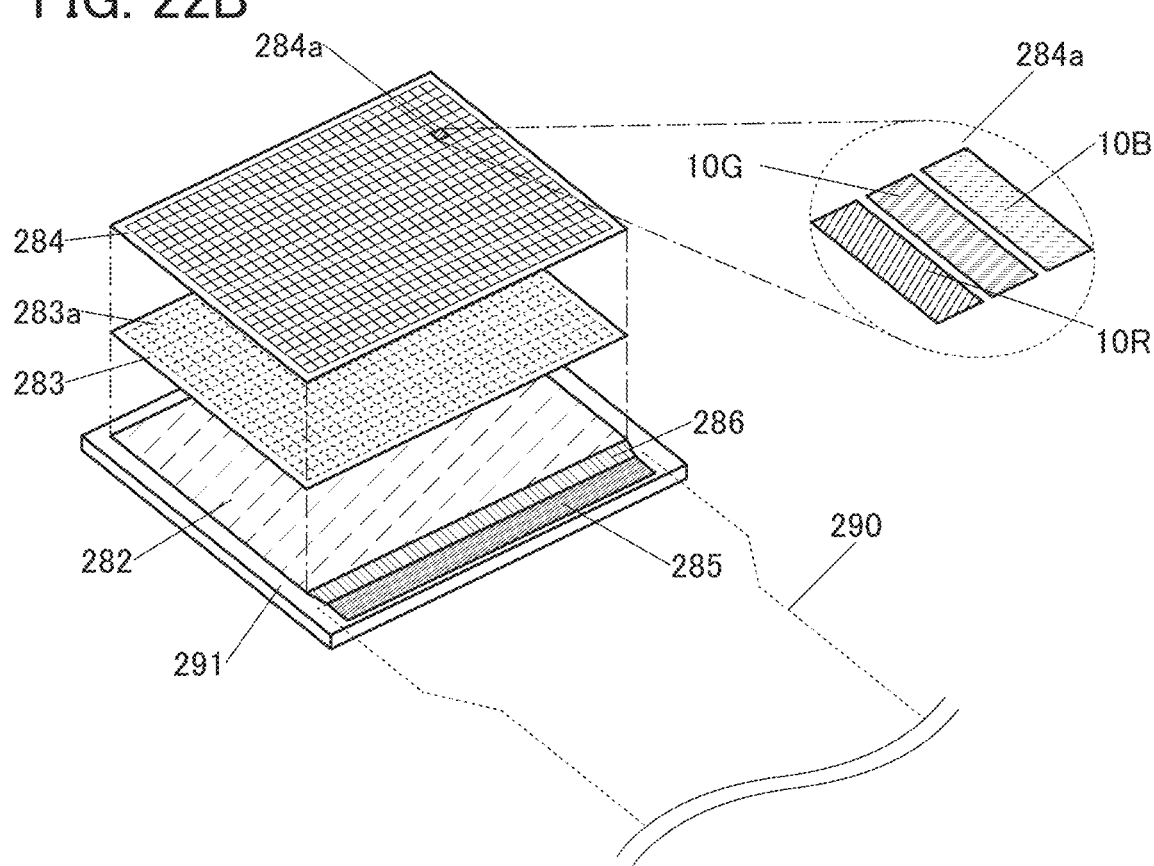

FIG. 22B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided over the substrate 291 in a portion that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 22B. The pixel 284a includes a plurality of subpixels emitting light of different colors (subpixels 10R, 10G, and 10B). The subpixel can employ any of the structures of the pixels described in the above embodiments. The pixel circuit portion 283 includes a plurality of pixel circuits 283a arranged periodically.

One pixel circuit 283a is a circuit that controls driving of a plurality of elements included in one pixel 284a. One pixel circuit 283a can be provided with three circuits each of which controls light emission of one light-emitting device. For example, the pixel circuit 283a can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display device is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted over the FPC 290.

The display module 280 can have a structure in which one or both of the pixel circuit portion 283 and the circuit portion 282 are provided to be stacked below the pixel portion 284;

thus, the aperture ratio (effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284a can be arranged extremely densely and thus, the display portion 281 can have an extremely high resolution. For example, the pixels 284a are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a device for VR such as an HMD or a glasses-type device for AR. For example, even in the case of a structure in which the display portion of the display module 280 is perceived through a lens, pixels of the extremely-high-resolution display portion 281 included in the display module 280 are not perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic devices, such as a wrist watch.

This embodiment can be implemented in an appropriate combination with the structures described in the other embodiments.

Embodiment 5

In this embodiment, electronic devices of one embodiment of the present invention are described with reference to FIG. 23A to FIG. 23D.

Electronic devices of this embodiment each include the display device of one embodiment of the present invention in a display portion. The display device of one embodiment of the present invention can be easily increased in resolution and definition. Thus, the display device of one embodiment of the present invention can be used for a display portion of a variety of electronic devices.

The display device of one embodiment of the present invention can have high resolution, and thus can be suitably used for an electronic device including a relatively small display portion. Examples of such an electronic device include watch-type and bracelet-type information terminal devices (wearable devices) and wearable devices capable of being worn on a head, such as a VR device like a head-mounted display, a glasses-type AR device, and an MR (Mixed Reality) device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840× 2160), or 8K (number of pixels: 7680×4320). In particular, a definition of 4K, 8K, or higher is preferable. The pixel density (resolution) of the display device of one embodiment of the present invention is preferably higher than or equal to 100 ppi, further preferably higher than or equal to 300 ppi, still further preferably higher than or equal to 500 ppi, yet still further preferably higher than or equal to 1000 ppi, yet still further preferably higher than or equal to 2000 ppi, yet still further preferably higher than or equal to 3000 ppi, yet still further preferably higher than or equal to 5000 ppi, yet still further preferably higher than or equal to 7000 ppi. With the use of such a display device with one or both of high definition and high resolution, an electronic device for portable use or home use can have higher realistic sensation, sense of depth, and the like. There is no particular limitation on the screen ratio (aspect ratio) of the display device of one embodiment of the present invention. For example, the display device is compatible with a variety of screen ratios such as 1:1 (a square), 4:3, 16:9, and 16:10.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of wearable devices capable of being worn on a head are described with reference to FIG. 23A to FIG. 23D. The wearable devices have at least one of a function of displaying AR contents, a function of displaying VR contents, a function of displaying SR (Substitutional Reality) contents, and a function of displaying MR contents. The electronic device having a function of displaying contents of at least one of AR, VR, SR, MR, and the like enables the user to feel a high sense of immersion.

Figures 23A, 23B, 23C, 23D:
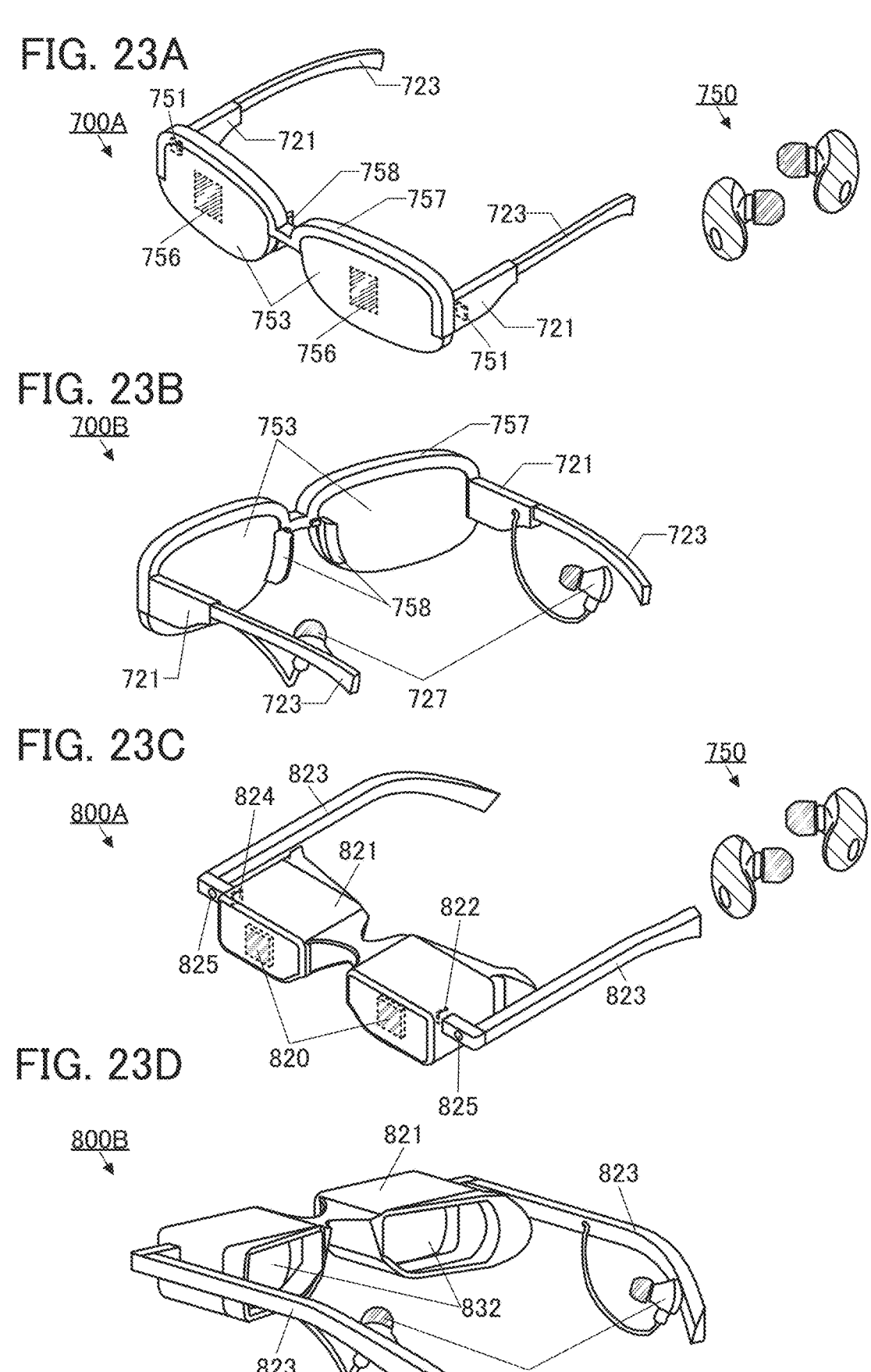
FIG. 23A to FIG. 23D are diagrams illustrating electronic devices.

An electronic device 700A illustrated in FIG. 23A and an electronic device 700B illustrated in FIG. 23B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used as the display panel 751. Thus, the electronic devices are capable of performing ultrahigh-resolution display.

In the case where the display device includes a light-receiving device, the light-receiving device can capture an image of an eye and perform the iris authentication. In addition, the light-receiving device can perform eye tracking. With eye tracking, an object or location at which a user looks can be specified, so that selection of the functions of the electronic device, execution of software, and the like can be performed.

The electronic device 700A and the electronic device 700B can each project images displayed on the display panels 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic device 700A and the electronic device 700B are provided with a battery so that they can be charged wirelessly and/or by wire.

An electronic device 800A illustrated in FIG. 23C and an electronic device 800B illustrated in FIG. 23D each include a pair of display portions 820, a housing 821, a communication portion 822, a pair of wearing portions 823, a control portion 824, a pair of image capturing portions 825, and a pair of lenses 832.

The display device of one embodiment of the present invention can be used in the display portions 820. Thus, the electronic devices are capable of performing ultrahigh-resolution display. Such electronic devices can provide an enhanced sense of immersion to the user.

The display portions 820 are positioned inside the housing 821 so as to be seen through the lenses 832. When the pair of display portions 820 display different images, three-dimensional display using parallax can also be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 23C or the like illustrates an example where the wearing portion 823 has a shape like a temple (also referred to as a joint or the like) of glasses; however, one embodiment of the present invention is not limited thereto. The wearing portions 823 can have any shape, for example, a shape of a helmet or a bands as long as the user can wear the electronic device.

An image capturing portion 825 has a function of obtaining external information. Data obtained by the image capturing portion 825 can be output to the display portion 820. An image sensor can be used for the image capturing portion 825. Moreover, a plurality of cameras may be provided so as to cover a plurality of angles of view, such as a telephoto angle of view and wide angle of view.

Note that although an example where the image capturing portion 825 is included is shown here, a range sensor that is capable of measuring the distance between the user and an object (hereinafter such a sensor is also referred to as a sensing portion) is provided. In other words, the image capturing portion 825 is one embodiment of the sensing portion. As the sensing portion, an image sensor or a distance image sensor such as LiDAR (Light Detection and Ranging) can be used, for example. By using images obtained by the camera and images obtained by the distance image sensor, more information can be obtained and a gesture operation with higher accuracy is possible.

The electronic device 800A may include a vibration mechanism that functions as bone-conduction earphones. For example, any one or more of the display portion 820, the housing 821, and the wearing portion 823 can employ a structure including the vibration mechanism. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., sound data) from the electronic device with the wireless communication function. For example, the electronic device 700A in FIG. 23A has a function of transmitting information to the earphones 750 with the wireless communication function. As another example, the electronic device 800A in FIG. 23C has a function of transmitting information to the earphones 750 with the wireless communication function. The electronic device may include an earphone portion. The electronic device 700B in FIG. 23B includes earphone portions 727. For example, the earphone portion 727 and the control portion can be connected to each other by wire. Part of a wiring that connects the earphone portion 727 and the control portion may be positioned inside the housing 721 or the wearing portion 723.

Similarly, the electronic device 800B in FIG. 23D includes earphone portions 827. For example, the earphone portion 827 and the control portion 824 can be connected to each other by wire. Part of a wiring that connects the earphone portion 827 and the control portion 824 may be positioned inside the housing 821 or the wearing portion 823. Alternatively, the earphone portions 827 and the wearing portions 823 may include magnets. This is preferable because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of what is called a headset by including the audio input mechanism. As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

The electronic device to which the display device of one embodiment of the present invention can be applied may be connected to an external server through a network. The processing needing high arithmetic capability may be performed in a server connected through a network instead of the electronic device. Such processing is also referred to as what is called thin client, and limited processing is executed in a terminal (here, an electronic device) on a user side (a client side), advanced processing such as application execution and management is executed on a server side, whereby the scale of processing in a terminal on a client-side can be reduced. Accordingly, the electronic device does not need an arithmetic device having high arithmetic performance, which facilitates reductions in cost, weight, and size. In the electronic device of one embodiment of the present invention, the above-described thin client and processing needing high arithmetic capability on the electronic device side may be performed in combination.

This embodiment can be implemented in an appropriate combination with the structures described in the other embodiments.

REFERENCE NUMERALS

BG: node, BS: node, GL: gate line, SLO: slope potential, VDATA: data potential, VRESA: reset potential, VRESW: reset potential, VSBG: potential, 10$a$: pixel, 10B: subpixel, 10$b$: pixel, 10$c$: pixel, 10G: subpixel, 10R: subpixel, 10: pixel, 11: pulse signal generation portion, 13: pixel array, 20B: pixel, 20G: pixel, 20R: pixel, 20: source driver, 30: gate driver, 32: grayscale, 40: slope potential supply circuit, 50: slope potential generation circuit, 100A: display device, 100B: display device, 100E: display device, 100F: display device, 101: transistor, 102: transistor, 103: transistor, 104: transistor, 105: transistor, 106: transistor, 107: transistor, 108: transistor, 109: transistor, 110B: light-emitting device, 110G: light-emitting device, 110R: light-emitting device, 110: light-emitting device, 111: capacitor, 112: capacitor, 113: capacitor, 114: capacitor, 115: transistor, 116: transistor, 117: insulating layer, 118: support layer, 121: wiring, 122: wiring, 123: wiring, 124: wiring, 125: wiring, 127: wiring, 128: wiring, 129: wiring, 131: wiring, 132: wiring, 133: wiring, 134: wiring, 135: wiring, 136: wiring, 137: wiring, 138: wiring, 139: wiring, 140: transistor, 142: element isolation layer, 143: low-resistance region, 144: insulating layer, 145: conductive layer, 146: insulating layer, 147: conductive layer, 148: conductive layer, 149; insulating layer, 150: substrate, 151: insulating layer, 152: insulating layer, 160: transistor, 161: conductive layer, 162: insulating layer, 163: insulating layer, 164: insulating layer, 165: metal oxide layer, 166: conductive layer, 167: insulating layer, 168: conductive layer, 173: semiconductor layer, 174: light-emitting layer, 175: semiconductor layer, 176: conductive layer, 181: insulating layer, 182: insulating layer, 183: insulating layer, 184$a$: conductive layer, 184$b$: conductive layer, 185: insulating layer, 186: insulating layer, 187: insulating layer, 188: insulating layer, 189: insulating layer, 192: conductive layer, 195: conductive layer, 196: conductive layer, 197: conductive layer, 198: conductive layer, 199: conductive layer, 255: grayscale, 280: display module, 281: display portion, 282: circuit portion, 283$a$: pixel circuit, 283: pixel circuit portion, 284$a$: pixel, 284: pixel portion, 285: terminal portion, 286: wiring portion, 290: FPC, 291: substrate, 292: substrate, 310: layer, 311: Si transistor, 312: functional circuit, 320: layer, 321: OS transistor, 330: layer, 331: LED array, 340: layer, 350: light-blocking layer, 351: light-blocking layer, 360B: color conversion layer, 360G: color conversion layer, 360R: color conversion layer, 361B: coloring layer, 361G: coloring layer, 361R: coloring layer, 700A: electronic device, 700B: electronic device, 721: housing, 723: wearing portion, 727: earphone portion, 750: earphone, 751: display panel, 753: optical member, 756: display region, 757: frame, 758: nose pad, 800A: electronic device, 800B: electronic device, 820: display portion, 821: housing, 822: communication portion, 823: wearing portion, 824: control circuit, 825: image capturing portion, 827: earphone portion, 832: lens

The invention claimed is:

1. A display device comprising a pulse signal generation portion, a first node, a second node, a first transistor, a second transistor, a third transistor, a first capacitor, and a light-emitting device in a pixel, wherein the first node is electrically connected to one of a source and a drain of the first transistor, one of a source and a drain of the second transistor, and an input portion of the pulse signal generation portion, wherein the second node is electrically connected to the other of the source and the drain of the second transistor, a gate of the third transistor, one electrode of the first capacitor, and an output portion of the pulse signal generation portion, wherein one of a source and a drain of the third transistor is electrically connected to one electrode of the light-emitting device, wherein the other of the source and the drain of the third transistor is electrically connected to the other electrode of the first capacitor, wherein the pulse signal generation portion comprises fourth to ninth transistors and a second capacitor, wherein the fourth transistor comprises a first gate and a second gate, wherein the first gate of the fourth transistor and one of a source and a drain of the fifth transistor are electrically connected to the first node, wherein one of a source and a drain of the fourth transistor is electrically connected to a gate of the sixth transistor and one of a source and a drain of the seventh transistor, wherein the second gate of the fourth transistor is electrically connected to one of a source and a drain of the eighth transistor and one electrode of the second capacitor, wherein the other electrode of the second capacitor is electrically connected to one of a source and a drain of the ninth transistor, wherein the other of the source and the drain of the ninth transistor is electrically connected to the other of the source and the drain of the fourth transistor, and wherein one of a source and a drain of the sixth transistor is electrically connected to the second node.

2. The display device according to claim 1, wherein a signal potential with a ramp waveform is input to the other of the source and the drain of the fourth transistor.

3. The display device according to claim 1, wherein the first transistor, the second transistor, the fourth transistor, the fifth transistor, the eighth transistor, and the ninth transistor are each an n-channel transistor, and the third transistor, the sixth transistor, and the seventh transistor are each a p-channel transistor.

4. The display device according to claim 3, wherein the n-channel transistor comprises a metal oxide in a channel formation region, and the p-channel transistor comprises silicon in a channel formation region.

5. The display device according to claim 1, wherein the pixel makes the light-emitting device emit light in accordance with a data potential input to the first node, wherein the pulse signal generation portion generates a pulse signal in accordance with the data potential input to the second node, and wherein the pixel resets a potential of the first node in accordance with the pulse signal and makes the light-emitting device turn off.

6. The display device according to claim 1, wherein the light-emitting device is a micro LED.

7. An electronic device comprising the display device according to claim 1 and a camera.

* * * * *